(12) United States Patent
Lee et al.

(10) Patent No.: US 12,367,090 B2
(45) Date of Patent: Jul. 22, 2025

(54) STORAGE CONTROLLERS PERFORMING RESET OPERATIONS USING SETTING DATA, OPERATING METHODS OF STORAGE CONTROLLERS, AND OPERATING METHODS OF STORAGE DEVICES INCLUDING STORAGE CONTROLLERS

(71) Applicant: Samsung Electronics Co., Ltd., Suwon-si (KR)

(72) Inventors: Kyungduk Lee, Suwon-si (KR); Youn-Soo Cheon, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 169 days.

(21) Appl. No.: 18/134,096

(22) Filed: Apr. 13, 2023

(65) Prior Publication Data
US 2024/0012703 A1 Jan. 11, 2024

(30) Foreign Application Priority Data
Jul. 5, 2022 (KR) .......................... 10-2022-0082490

(51) Int. Cl.
*G06F 11/07* (2006.01)
*G06F 11/10* (2006.01)

(52) U.S. Cl.
CPC .......... *G06F 11/076* (2013.01); *G06F 11/073* (2013.01); *G06F 11/0793* (2013.01); *G06F 11/1008* (2013.01)

(58) Field of Classification Search
CPC ............... G06F 11/0754; G06F 11/076; G06F 11/0763; G06F 11/08; G06F 11/1008; G06F 11/1068; G06F 11/1402; G06F 11/1415; G06F 11/1446; G06F 11/1458; G06F 11/1666; G06F 11/2053; G11B 20/1803; G11C 29/52
See application file for complete search history.

(56) References Cited

U.S. PATENT DOCUMENTS 7,437,631 B2    10/2008    Auclair et al.
7,640,454 B1 *   12/2009    Botes .................. G06F 11/1469
                                                                              714/19

(Continued)

FOREIGN PATENT DOCUMENTS

EP          2549482 A1     1/2013
KR     20190089429 A     7/2019

*Primary Examiner* — Gabriel Chu
(74) *Attorney, Agent, or Firm* — Myers Bigel, P.A.

(57) ABSTRACT

An operating method of a storage controller which is configured to communicate with a host and with a non-volatile memory device. The method may include: generating an error count by counting a number of first-type error bits of a target super block of the non-volatile memory device, determining whether the error count exceeds a first reference value, fetching setting data from a latch unit of the non-volatile memory device, based on determining that the error count exceeds the first reference value, determining whether reference setting data of a setting table matches the fetched setting data, the reference setting data indicating information about a designed operating environment of the non-volatile memory device, and providing a reset request to the latch unit, based on determining that the reference setting data does not match the fetched setting data.

18 Claims, 13 Drawing Sheets

(56) References Cited

U.S. PATENT DOCUMENTS

| | | | |
|---|---|---|---|
| 7,996,711 B2 | 8/2011 | Edwards et al. | |
| 9,021,331 B2 | 4/2015 | Wu et al. | |
| 9,098,399 B2 * | 8/2015 | Ellis | G06F 12/0246 |
| 9,594,615 B2 | 3/2017 | Shur et al. | |
| 9,989,655 B2 | 6/2018 | Hannah | |
| 11,086,561 B2 | 8/2021 | Youn et al. | |
| 2010/0169742 A1 | 7/2010 | Hopkins | |
| 2012/0124358 A1 * | 5/2012 | Li | G06F 11/1415 |
| | | | 713/2 |
| 2013/0080830 A1 * | 3/2013 | Won | G11C 7/1006 |
| | | | 714/15 |
| 2014/0245061 A1 * | 8/2014 | Kobayashi | G06F 11/0706 |
| | | | 714/6.11 |
| 2014/0310510 A1 * | 10/2014 | Potlapally | G06F 9/4406 |
| | | | 714/19 |
| 2023/0393955 A1 * | 12/2023 | Mason | G11C 29/4401 |
| 2024/0053905 A1 * | 2/2024 | Basu | G11C 7/1006 |

\* cited by examiner

STORAGE CONTROLLERS PERFORMING RESET OPERATIONS USING SETTING DATA, OPERATING METHODS OF STORAGE CONTROLLERS, AND OPERATING METHODS OF STORAGE DEVICES INCLUDING STORAGE CONTROLLERS

CROSS-REFERENCE TO RELATED APPLICATION

This application claims priority under 35 U.S.C. § 119 to Korean Patent Application No. 10-2022-0082490, filed on Jul. 5, 2022, in the Korean Intellectual Property Office, and the entire contents of the above-identified application are incorporated by reference herein.

TECHNICAL FIELD

Aspects of the present disclosure relate to storage controllers, and more particularly, relate to storage controllers performing a reset operation by using setting data, an operating method of the storage controller, and an operating method of a storage device including the storage controller.

BACKGROUND

A memory device stores data in response to a write request and outputs data stored therein in response to a read request. Memory devices may be classified as volatile memory devices, which lose data stored therein when a power supply is interrupted, or as non-volatile memory devices, which retain data stored therein even when a power supply is interrupted. Examples of volatile memory devices include dynamic random access memory (DRAM) devices and static RAM (SRAM) devices, and examples of non-volatile memory devices include flash memory devices, phase-change RAM (PRAM) devices, magnetic RAM (MRAM) devices, and resistive RAM (RRAM) devices.

Non-volatile memory devices may include a latch circuit that stores setting data (or configuration data) for an operation of memory cells. A non-volatile memory device may set a direct current (DC) level, a verification voltage level, etc. of the memory cells based on the setting data stored in the latch circuit. When a soft error occurs in the latch circuit due to radiation, setting data may be stored in the latch circuit that are different from reference setting data generated in the process of designing the non-volatile memory device. When the memory cells are set based on the (potentially erroneous) setting data that is different from the reference setting data, the reliability of the read operation and the write operation of the non-volatile memory device may be reduced. To prevent such issues, techniques for detecting and correcting soft errors caused in the latch circuit are under investigation.

SUMMARY

Some embodiments of the present disclosure provide a storage controller performing a reset operation by using setting data, an operating method of the storage controller, and an operating method of a storage device including the storage controller.

According to some embodiments, an operating method of a storage controller configured to communicate with a host and with a non-volatile memory device may include: generating an error count by counting a number of first-type error bits of a target super block of the non-volatile memory device, determining whether the error count exceeds a first reference value, fetching setting data from a latch unit of the non-volatile memory device, based on a determination that the error count exceeds the first reference value, determining whether reference setting data of a setting table are matched with the fetched setting data, the reference setting data indicating information about a designed operating environment of the non-volatile memory device, and providing a reset request to the latch unit, based on determining that the reference setting data does not match the fetched setting data.

According to some embodiments, a storage controller may include an error manager, and a setting data table that includes reference setting data. The error manager may be configured to: generate an error count by counting the number of first-type error bits of a target super block of a non-volatile memory device controlled by the storage controller, determine whether the error count exceeds a first reference value, fetch setting data from a latch unit of the non-volatile memory device, based on determining that the error count exceeds the first reference value, determine whether the reference setting data matches the fetched setting data, and provide a reset request to the latch unit, based on determining that the reference setting data does not match the fetched setting data. The reference setting data may indicate information about a designed operating environment of the non-volatile memory device.

According to some embodiments, an operating method of a storage device configured to communicate with a host. The storage device may include a storage controller and a non-volatile memory device. The operating method may include generating, by the storage controller, an error count by counting the number of first-type error bits of a target super block of the non-volatile memory device, determining, by the storage controller, whether the error count exceeds a first reference value, transmitting, by the storage controller, a fetch request to a latch unit of the non-volatile memory device, based on determining that the error count exceeds the first reference value, providing, by the non-volatile memory device, setting data of the latch unit to the storage controller, determining, by the storage controller, whether reference setting data match the setting data, the reference setting data indicating information about a designed operating environment of the non-volatile memory device, and providing, by the storage controller, a reset request to the latch unit, based on determining that the reference setting data does not match the setting data.

BRIEF DESCRIPTION OF THE FIGURES

The above and other objects and features of the inventive concepts provided by the present disclosure will become apparent by describing in detail some examples of embodiments thereof with reference to the accompanying drawings.

DETAILED DESCRIPTION

Below, some embodiments of the present disclosure will be described in detail and with sufficient clarity such that those skilled in the art may implement one or more embodiments of the present disclosure.

Figure 1:
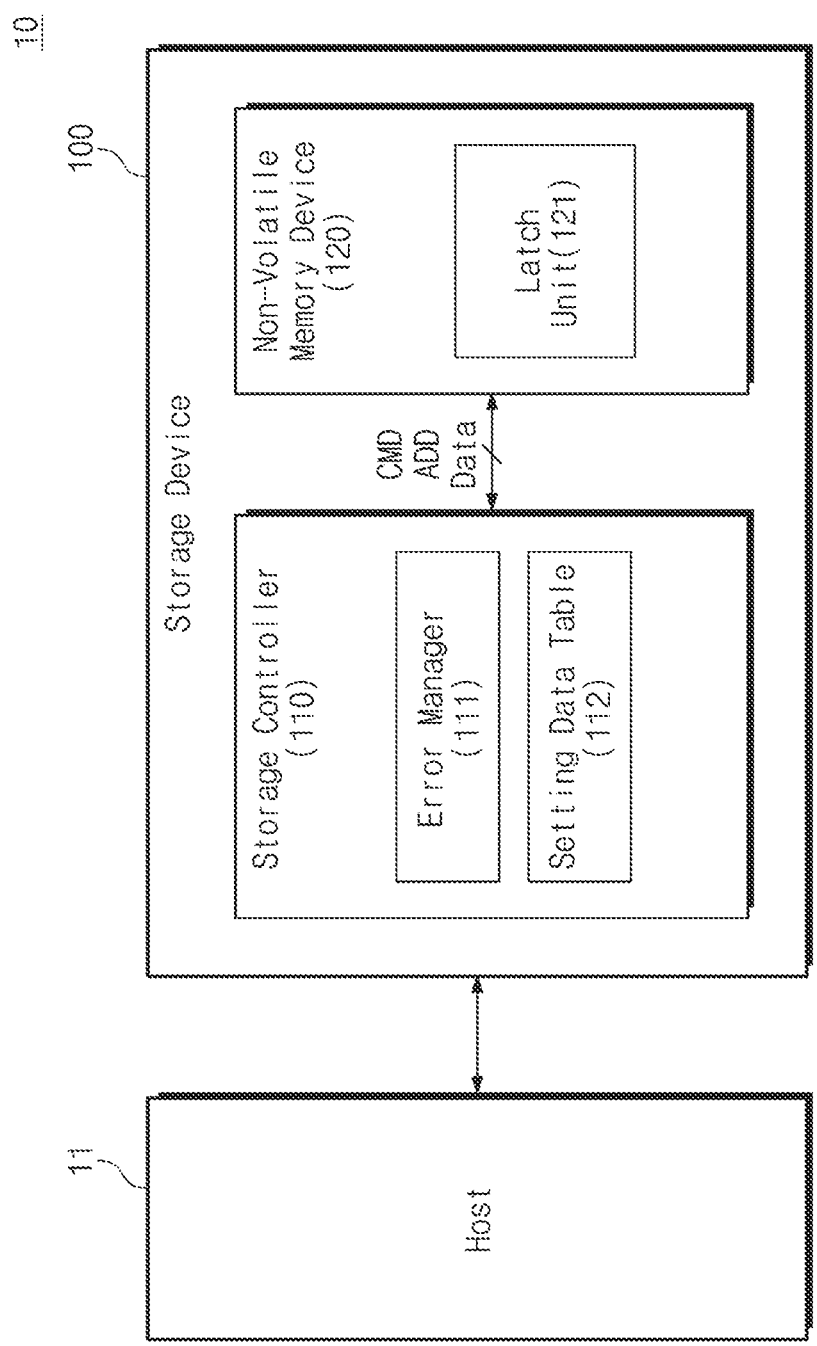
FIG. 1 is a block diagram of a storage system according to some embodiments of the present disclosure.

FIG. 1 is a block diagram of a storage system according to some embodiments of the present disclosure. Referring to FIG. 1, a storage system 10 may include a host 11 and a storage device 100. In some embodiments, the storage system 10 may be a computing system, which may be configured to process a variety of information. Non-limiting examples of such a computing system include a personal computer (PC), a notebook, a laptop, a server, a workstation, a tablet PC, a smartphone, a digital camera, or a black box.

The host 11 may control an overall operation of the storage system 10. For example, the host 11 may store data in the storage device 100 and/or may read data stored in the storage device 100. For example, the host 11 may provide write data to the storage device 100, or the host 11 may request read data stored in the storage device 100.

The storage device 100 may include a storage controller 110 and a non-volatile memory device 120. The non-volatile memory device 120 may store data. The storage controller 110 may store data in the non-volatile memory device 120 and/or may read data stored in the non-volatile memory device 120. The non-volatile memory device 120 may operate under control of the storage controller 110. For example, based on a command CMD indicating an operation and an address ADD indicating a location of data, the storage controller 110 may store the data in the non-volatile memory device 120 and/or may read the data stored in the non-volatile memory device 120.

In some embodiments, the non-volatile memory device 120 may be a NAND flash memory device, but the present disclosure is not limited thereto. For example, the non-volatile memory device 120 may be one of various storage devices that retain data stored therein even though a power is turned off, such as a phase-change random access memory (PRAM) device, a magnetic random access memory (MRAM) device, a resistive random access memory (RRAM) device, or a ferroelectric random access memory (FRAM) device.

The non-volatile memory device 120 may include a latch unit 121. The latch unit 121 may store setting data associated with an operating environment of memory cells (not shown) of the non-volatile memory device 120. The setting data may include direct current (DC) level information, verification voltage level information, bad block information, or the like. In some embodiments, the latch unit 121 may include a plurality of electronic fuse (E-fuse) latches.

In some embodiments, the non-volatile memory device 120 may include a setting data block. The setting data block may refer to a memory block that stores reference setting data. The reference setting data may include pieces of information about an operating environment of the memory cells that are determined during a design of the storage device 100 (e.g., when a user designs the storage device 100). When the storage device 100 is powered on, the reference setting data may be loaded from the setting data block and may be stored in the latch unit 121.

After the storage device 100 is powered on, a soft error may occur in the latch unit 121, and the soft error may result in setting data that are different from the reference setting data being stored in the latch unit 121. For example, when the soft error occurs in the latch unit 121, the operating environment of the memory cells may be configured based on the setting data resulting from the soft error, rather than the reference setting data. In this case, because the operating environment of the respective memory cells is changed, there may be stored data that are different from data received (e.g., actually received) from the host 11 in the write operation, and there may be read data that are different from data stored (e.g., actually stored) in the memory cells in the read operation. That is, the performance of operation of the storage device 100 may be reduced.

The storage controller 110 may include an error manager 111 and a setting data table 112.

The error manager 111 may perform an error detection operation and an error correction operation on the latch unit 121 of the non-volatile memory device 120. The error manager 111 may detect an error that occurs in the latch unit 121. In greater detail, the error manager 111 may detect the soft error that occurs in the latch unit 121. The soft error may mean that a bit value of the setting data stored in the latch unit 121 has been flipped, for example due to neutrons in the air. Because the soft error is not a physical error, the soft error may disappear when a device experiencing the soft error is restarted. However, it may be difficult to the host 11 or the storage system 10 to observe the soft error caused while operating. In the case where the soft error caused while operating is not corrected, the reliability of operation of the storage device 100 may be reduced.

In some embodiments, the error manager 111 may determine whether the reference setting data are matched with data currently present in the latch unit 121. When the reference setting data are not matched with data currently present in the latch unit 121, the error manager 111 may determine that the soft error has occurred in the latch unit 121.

When it is determined that the soft error has occurred in the latch unit 121, the error manager 111 may perform an error correction operation. In some embodiments, when it is determined that the soft error has occurred in the latch unit 121, the error manager 111 may send an initialization request and a load request to the non-volatile memory device 120. The initialization request may be used to delete (or erase) the setting data stored in the latch unit 121. The load request may be used to load the reference setting data stored in a setting data block 125*a* (refer to FIG. 3) to the latch unit 121.

The setting data table 112 may manage the reference setting data. For example, the setting data table 112 may store bit values of the reference setting data. The error manager 111 may detect the soft error caused in the latch unit 121, based on the reference setting data in the setting data table 112.

As described above, according to some embodiments of the present disclosure, the storage controller 110 may perform the error detection operation and the error correction operation. Even though the soft error occurs in the latch unit 121, through the error correction operation, the storage controller 110 may detect and correct the soft error while the storage device 100 is operating. The reliability of operation of the storage device 100 may be improved by correcting the soft error caused in the latch unit 121. Also, in general, and in contrast to the method in which the soft error is corrected by powering off the storage device 100, the soft error caused in the latch unit 121 may be corrected without powering off the storage device 100.

Figure 2:
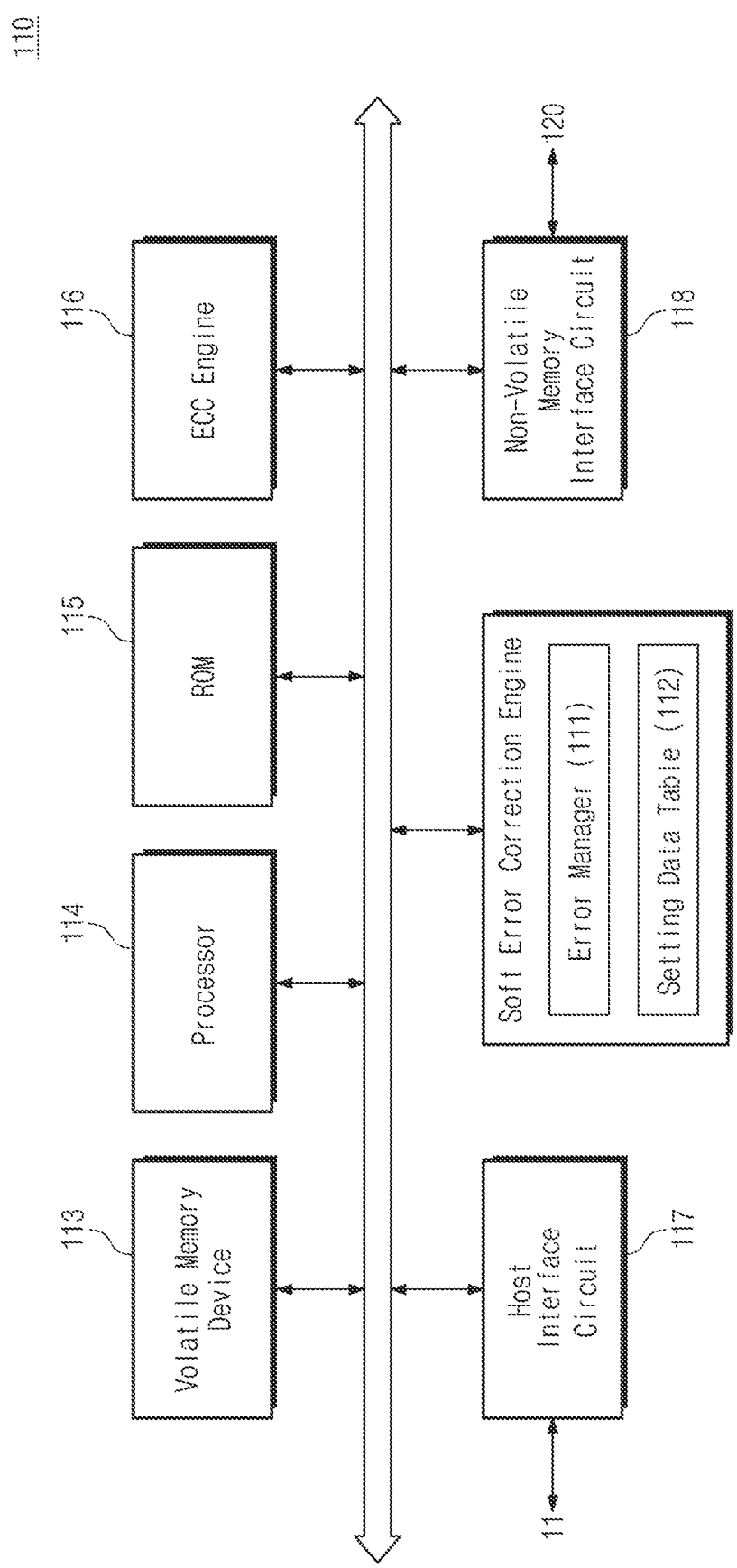
FIG. 2 is a block diagram illustrating a storage controller of FIG. 1 in detail, according to some embodiments of the present disclosure.

FIG. 2 is a block diagram illustrating a storage controller of FIG. 1 in greater detail, according to some embodiments of the present disclosure. Referring to FIGS. 1 and 2, the storage controller 110 may communicate with the host 11 and the non-volatile memory device 120.

The storage controller 110 may include the error manager 111, the setting data table 112, a volatile memory device 113, a processor 114, a read only memory (ROM) 115, an error correcting code (ECC) engine 116, a host interface circuit 117, and a non-volatile memory interface circuit 118.

The error manager 111 and the setting data table 112 may be referred to collectively as a "soft error correction engine." The soft error correction engine may perform the error detection operation and the error correction operation on the latch unit 121 of the non-volatile memory device 120. The error manager 111 and the setting data table 112 may respectively correspond to the error manager 111 and the setting data table 112 of FIG. 1.

In some embodiments, the soft error correction engine may be implemented by firmware. For example, the non-volatile memory device 120 may store instructions corresponding to the soft error correction engine. The processor 114 may load the instructions of the non-volatile memory device 120 to the volatile memory device 113. The processor 114 may execute the loaded instructions such that the soft error correction engine operates.

The volatile memory device 113 may be used as a main memory, a cache memory, or a working memory of the storage controller 110. For example, the volatile memory device 113 may be implemented with a static random access memory (SRAM) or a dynamic random access memory (DRAM).

The processor 114 may control an overall operation of the storage controller 110. The ROM 115 may be used as a read only memory that stores information used in the operation of the storage controller 110. The ECC engine 116 may detect and correct an error of data read from the non-volatile memory device 120. For example, the ECC engine 116 may have an error correction capability of a given level. The ECC engine 116 may process data having an error level (e.g., the number of flipped bits) exceeding the error correction capability as an uncorrectable error.

The storage controller 110 may communicate with the host 11 through the host interface circuit 117. In some embodiments, the host interface circuit 117 may be implemented based on at least one of various interfaces such as a serial ATA (SATA) interface, a peripheral component interconnect express (PCIe) interface, a serial attached SCSI (SAS) interface, a nonvolatile memory express (NVMe) interface, a universal flash storage (UFS) interface, and/or a compute eXpress link (CXL) interface.

The storage controller 110 may communicate with the non-volatile memory device 120 through the non-volatile memory interface circuit 118. In some embodiments, the non-volatile memory interface circuit 118 may be implemented based on a NAND interface. Also, the storage controller 110 may fetch the setting data stored in the latch unit 121 through the non-volatile memory interface circuit 118. In some embodiments, the non-volatile memory interface circuit 118 may be implemented with a universal internal bus (UIB) interface circuit.

Figure 3:
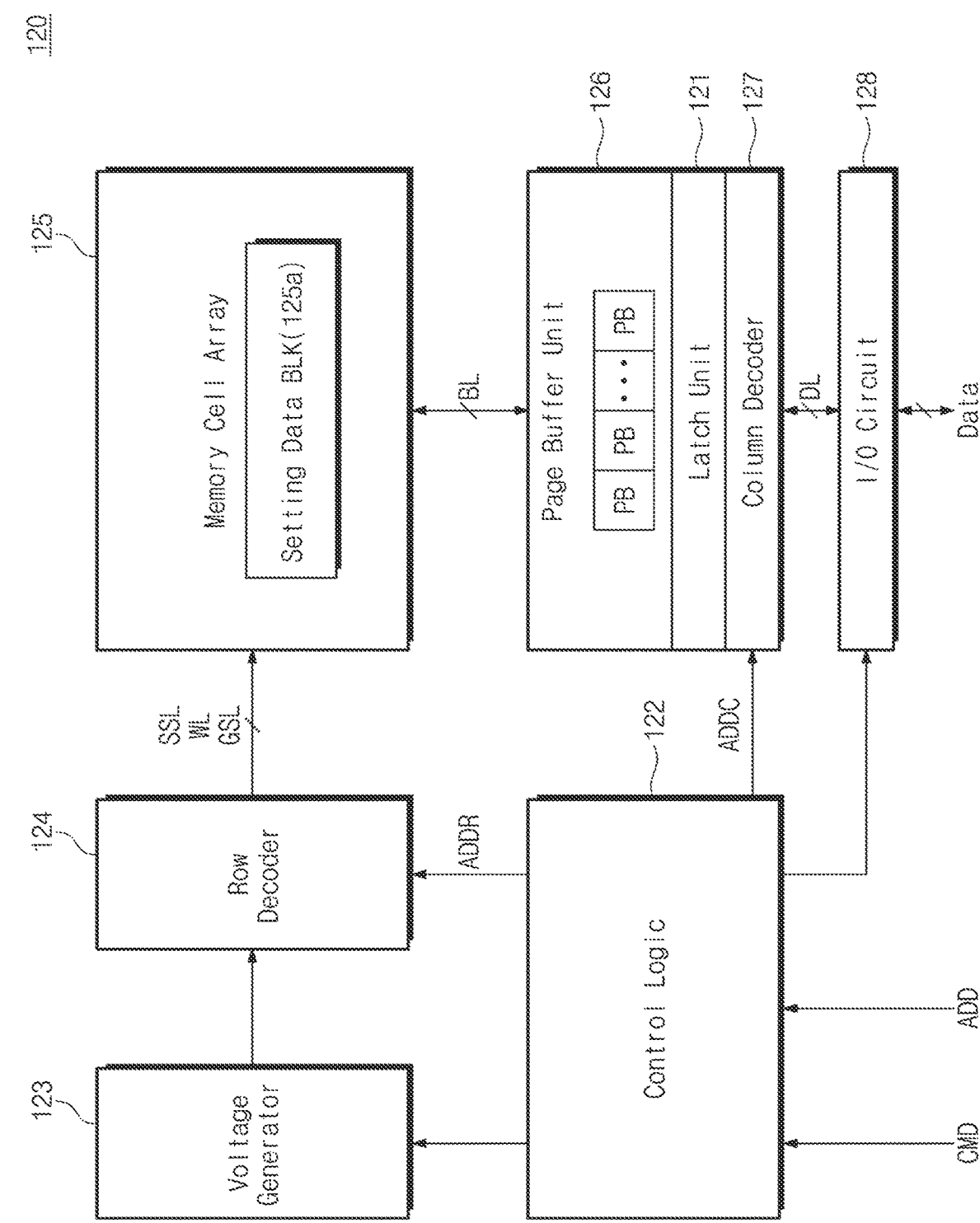
FIG. 3 is a block diagram illustrating a non-volatile memory device of FIG. 1 in detail, according to some embodiments of the present disclosure.

FIG. 3 is a block diagram illustrating a non-volatile memory device of FIG. 1 in greater detail, according to some embodiments of the present disclosure. Referring to FIGS. 1 and 3, the non-volatile memory device 120 may communicate with the storage controller 110. For example, the non-volatile memory device 120 may receive the address ADD and the command CMD from the storage controller 110. The non-volatile memory device 120 may exchange data with the storage controller 110.

The non-volatile memory device 120 may include the latch unit 121, control logic 122, a voltage generator 123, a row decoder 124, a memory cell array 125, a page buffer unit 126, a column decoder 127, and an input/output (I/O) circuit 128. The latch unit 121 may correspond to the latch unit 121 of FIG. 1.

The control logic 122 may receive the command CMD and the address ADD from the storage controller 110. The command CMD may refer to a signal indicating an operation to be performed by the non-volatile memory device 120, such as a read operation, a write operation, or an erase operation. The address ADD may include or indicate a row address ADDR and a column address ADDC. The control logic 122 may control an overall operation of the non-volatile memory device 120 based on the command CMD and the address ADD. The control logic 122 may generate the row address ADDR and the column address ADDC based on the address ADD.

Under control of the control logic 122, the voltage generator 123 may generate and/or control voltages to be applied to the memory cell array 125 through the row decoder 124.

The row decoder 124 may receive the row address ADDR from the control logic 122. The row decoder 124 may be connected with the memory cell array 125 through string selection lines SSL, word lines WL, and ground selection lines GSL. The row decoder 124 may decode the row address ADDR and may control voltages to be applied to the string selection lines SSL, the word lines WL, and the ground selection lines GSL based on a decoding result and a voltage(s) received from the voltage generator 123.

Depending on voltages applied from the row decoder 124, the memory cell array 125 may store data or may output the stored data. The memory cell array 125 may include the setting data block 125*a*. The setting data block 125*a* may be a memory block that is configured to store the reference setting data associated with the memory cell array 125.

The page buffer unit 126 may include a plurality of page buffers PB. The page buffer unit 126 may be connected with the memory cell array 125 through the bit lines BL. The page buffer unit 126 may read data from the memory cell array 125 in units of page (e.g., in page-sized units), by sensing voltages of the bit lines BL.

In a read operation, the column decoder 127 may receive the column address ADDC from the control logic 122. The column decoder 127 may decode the column address ADDC and may provide the data read by the page buffer unit 126 to the I/O circuit 128 based on a decoding result.

In a write operation, the column decoder 127 may receive data from the I/O circuit 128 through data lines DL. The column decoder 127 may receive the column address ADDC from the control logic 122. The column decoder 127 may decode the column address ADDC and may provide the data received from the I/O circuit 128 to the page buffer unit 126 based on a decoding result. The page buffer unit 126 may store the data provided from the I/O circuit 128 in the memory cell array 125 through the bit lines BL in units of page (e.g., page-sized units).

The I/O circuit 128 may be connected with the column decoder 127 through the data lines DL. The I/O circuit 128 may provide data received from the storage controller 110 to the column decoder 127 through the data lines DL. The I/O circuit 128 may output data received through the data lines DL to the storage controller 110.

Figure 4:
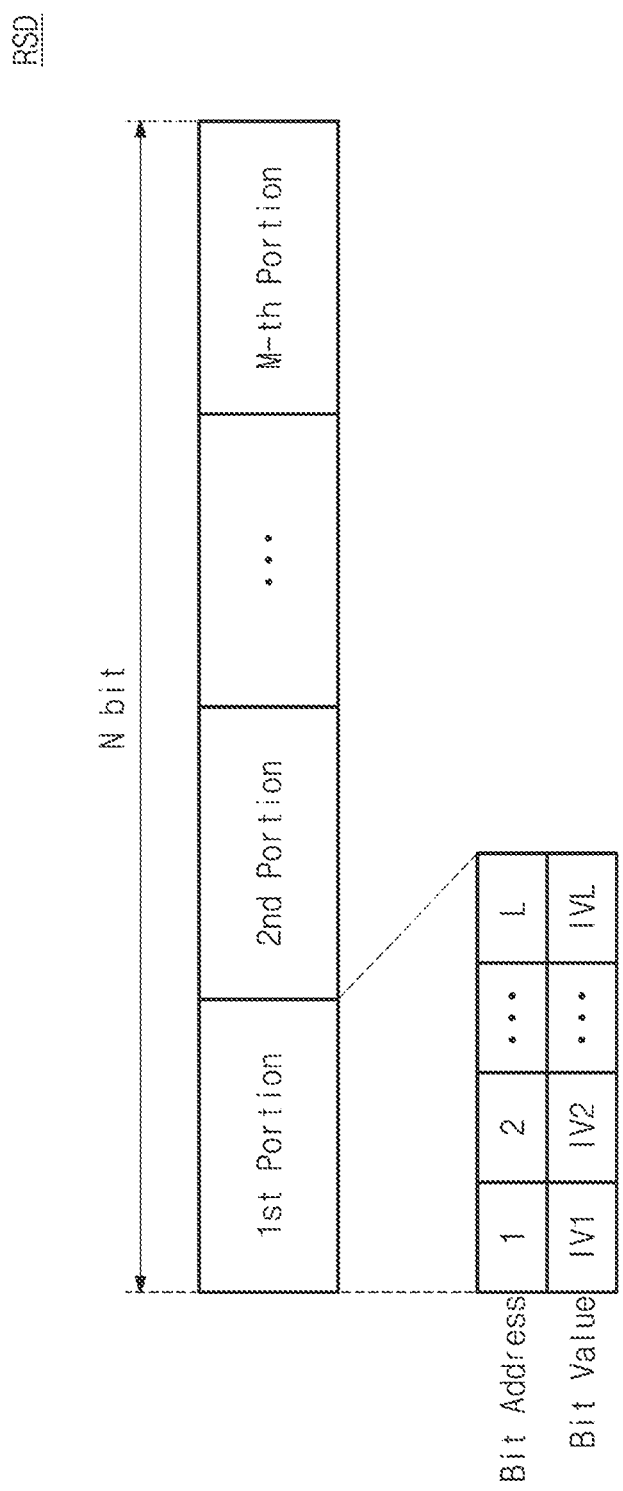
FIG. 4 is a diagram describing setting data according to some embodiments of the present disclosure.

FIG. 4 is a diagram describing setting data according to some embodiments of the present disclosure. Reference setting data RSD stored in the setting data table 112 will be described with reference to FIGS. 1 and 4.

The reference setting data RSD may include a plurality of information about the operating environment of the non-volatile memory device 120. The reference setting data RSD may be stored in the setting data table 112 of the storage controller 110. The reference setting data RSD may be stored in a setting data block among the memory blocks of the non-volatile memory device 120. When the storage device 100 is turned on, the reference setting data RSD stored in the setting data block may be loaded to the latch unit 121.

The reference setting data RSD may include first to N-bit bits. The reference setting data RSD may include first to M-th portions. In some embodiments, the first portion may include first to L-th bits. The first to L-th bits may have first to L-th bit values IV1 to IVL, respectively. Each of "N" and "M" may be a natural number greater than "1". Herein, "L" is a natural number that is smaller than "N" and is greater than "1".

In some embodiments, each of the first to M-th portions may store at least one of the plurality of information about the operating environment. For example, in the reference setting data RSD, the first portion may include information about a verification voltage level of each of memory cells, the second portion may include information about a DC voltage level of each of the memory cells, and the M-th portion may include information about a bad block.

The user may set a portion from among the first to M-th portions of the reference setting data RSD as a major portion. The major portion may include major information. In some embodiments, when an error occurs among the plurality of information, the user may set information with a high probability of producing an error in the operation of the storage device 100 as major information. For example, the user may set information about the verification voltage level as the major information and may set the first portion including the information about the verification voltage level as the major portion.

The present disclosure describes setting information with high probability of producing an error in the operation of the storage device 100 as major information when an error occurs among a plurality of information, but the present disclosure is not limited thereto. For example, the user may set at least one of the plurality of information as the major information.

The numbers of bits included in the first to M-th portions may be different depending on information stored in the first to M-th portions. For example, the first portion may include "L" bits, and the second portion may include (L+1) or more bits, or (L−1) or fewer bits.

Figure 5:
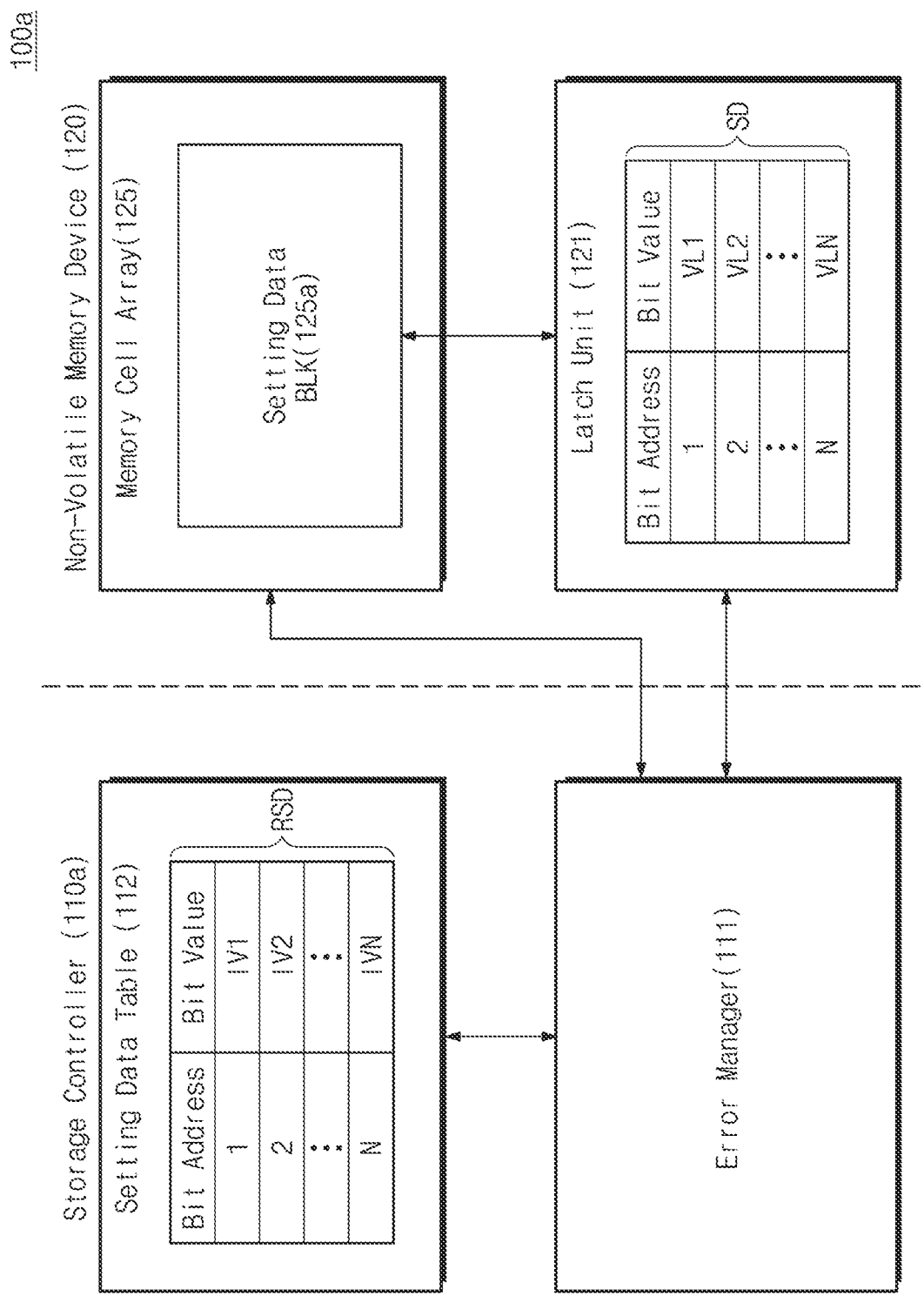
FIG. 5 is a block diagram describing a storage device according to some embodiments of the present disclosure.

FIG. 5 is a block diagram describing a storage device according to some embodiments of the present disclosure. Referring to FIG. 5, a storage device 100a may include a storage controller 110a and the non-volatile memory device 120.

The storage controller 110a may include the error manager 111 and the setting data table 112. The setting data table 112 may store the reference setting data RSD described with reference to FIG. 4.

The error manager 111 may detect an error in data that is read from a target super block of the non-volatile memory device 120 and may generate an error count. In some embodiments, the error manager 111 may count the number of first-type error bits of the target super block and may generate an error count. The target super block may be a super block that is targeted for a command received from the host. The first-type error bit may refer to a bit whose value is different from that of data corresponding to the command received from the host. For example, the first-type error bit may correspond to a hard error.

An example where the error manager 111 generates the error count is illustrated, but the present disclosure is not limited thereto. For example, the ECC engine 116 may generate the error count corresponding to the target super block and may send the error count to the error manager 111.

The error manager 111 may determine whether the error count exceeds a first reference value. The first reference value may be used as the criterion for determining whether hard errors corresponding to the target super block are being generated more than would be expected in a normal operation.

When the error manager 111 determines that the error count exceeds the first reference value, the error manager 111 may determine whether the soft error occurs or has occurred in the latch unit 121, with reference to the setting data table 112. In some embodiments, the error manager 111 may fetch the setting data present in the latch unit 121. The error manager 111 may determine whether the fetched setting data are matching with the reference setting data RSD stored in the setting data table 112.

In some embodiments, the error manager 111 may compare the fetched setting data and the reference setting data RSD in the setting data table 112 for each bit (or bit by bit). The error manager 111 may compare the fetched setting data and the reference setting data RSD for each bit and may determine a second-type error bit indicating that bit values are not matched. For example, the second-type error bit may correspond to a soft error.

In greater detail, the error manager 111 may compare the first to N-th bits of the fetched setting data and the first to N-th bits of the reference setting data RSD, respectively. Herein "N" is a natural number greater than 1. The first to N-th bits of the fetched setting data may respectively correspond to the first to N-th bits of the reference setting data RSD.

For example, the error manager 111 may determine whether the first bit value VL1 of the fetched setting data and the first bit value IV1 of the reference setting data RSD coincide or match with each other. The error manager 111 may determine whether the second bit value VL2 of the fetched setting data and the second bit value IV2 of the reference setting data RSD coincide or match with each other. When the first bit value VL1 of the fetched setting data and the first bit value IV1 of the reference setting data RSD do not coincide or match with each other, the error manager 111 may determine that the first bit corresponds to the second-type error bit.

In some embodiments, the error manager 111 may compare the major portion of the reference setting data RSD and the major portion of the fetched setting data for each bit. For example, when the major portion is the first portion, the error manager 111 may determine whether the first to L-th bits of the fetched setting data are respectively matched with the first to L-th bits of the reference setting data RSD.

When it is determined that the fetched setting data are not matched with the reference setting data RSD in the setting data table 112, the error manager 111 may perform the error correction operation. In some embodiments, when the error manager 111 determines that at least one second-type error bit exists, the error manager 111 may perform the error correction operation.

During the error correction operation, the error manager 111 may send the initialization request and the load request to the latch unit 121. The initialization request may be used to delete (or erase) the setting data stored in the latch unit 121. In some embodiments, the latch unit 121 may delete all the setting data present in the latch unit 121 in response to the initialization request. The latch unit 121 may delete setting data corresponding to the major portion among the setting data in the latch unit 121 in response to the initialization request. The latch unit 121 may delete setting data corresponding to the second-type error bit among the setting data in the latch unit 121 in response to the initialization request.

The load request may be used to load the setting data stored in the setting data block 125a to the latch unit 121. For example, the load request may be an IDR (Information Data Read) request. In some embodiments, the latch unit 121 may load all the setting data present in the latch unit 121 from the setting data block 125a in response to the load request. The latch unit 121 may load setting data corresponding to the major portion among the setting data present in the latch unit 121 from the setting data block 125a in response to the load request. The latch unit 121 may load setting data corresponding to the second-type error bit among the setting data in the latch unit 121 from the setting data block 125a in response to the load request.

The non-volatile memory device 120 may include the setting data block 125a and the latch unit 121. The setting data block 125a may store the reference setting data RSD described with reference to FIG. 4. When the storage device 100a is powered on, the latch unit 121 may perform the load operation. The load operation may refer to an operation of loading the reference setting data RSD from the setting data block 125a to the latch unit 121. For example, the load operation may be an IDR (Information Data Read) operation.

The latch unit 121 may include a plurality of latch circuits. The plurality of latch circuits may respectively store the bit values of the reference setting data RSD. However, when the soft error occurs in the latch unit 121, a bit value stored in at least one of the plurality of latch circuits may be flipped. That is, after the storage device 100a is powered on, setting data that are different from the reference setting data RSD may be stored in the latch unit 121 due to the occurrence of the soft error.

Figure 6:
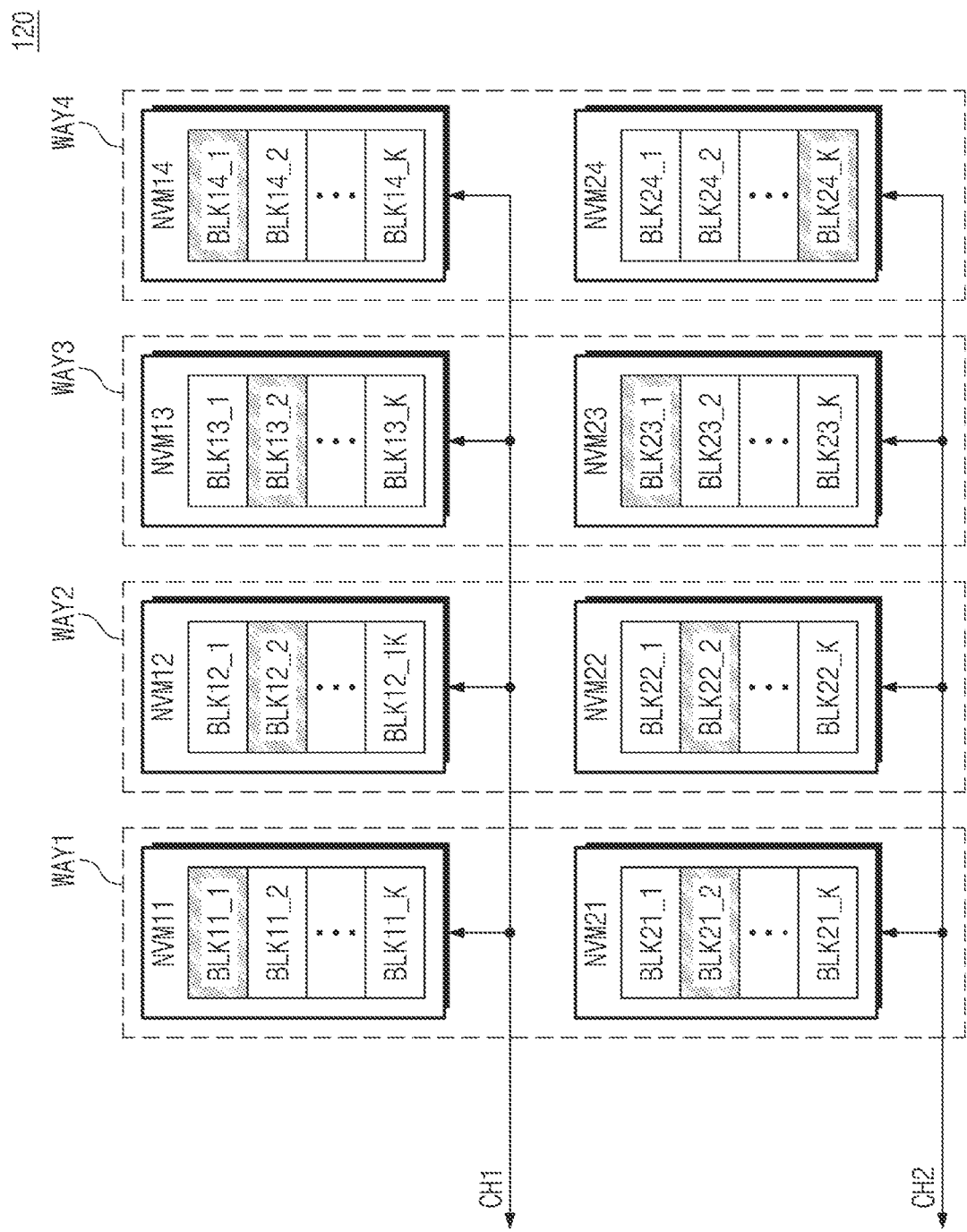
FIG. 6 is a diagram describing an error detection operation of a storage device according to some embodiments of the present disclosure.

FIG. 6 is a diagram describing a super block according to some embodiments of the present disclosure. Referring to FIGS. 1 and 6, the non-volatile memory device 120 may include a plurality of non-volatile memories NVM11 to NVM24. Each of the plurality of non-volatile memories NVM11 to NVM24 may be implemented with one semiconductor chip, one semiconductor die, or one semiconductor package.

Each of the plurality of non-volatile memories NVM11 to NVM24 may include a plurality of memory blocks. For example, the first non-volatile memory NVM11 may include first to K-th memory blocks BLK11_1 to BLK11_K. Herein, "K" is a natural number greater than 1.

The super block may refer to a group of memory blocks, which are programmed at the same time by the same programming request, from among the plurality of memory blocks of the plurality of non-volatile memories NVM11 to NVM24. Referring to FIG. 6, when the first memory block BLK11_1 of the first non-volatile memory NVM11, the second memory block BLK12_2 of the second non-volatile memory NVM12, the second memory block BLK13_2 of the third non-volatile memory NVM13, the first memory block BLK14_1 of the fourth non-volatile memory NVM14, the second memory block BLK21_2 of the fifth non-volatile memory NVM21, the second memory block BLK22_2 of the sixth non-volatile memory NVM22, the first memory block BLK23_1 of the seventh non-volatile memory NVM23, and the K-th memory block BLK24_K of the eighth non-volatile memory NVM24 are programmed at the same time by one programming request, the first super block may include the plurality of memory blocks described above and shaded in FIG. 6.

Some (e.g., non-volatile memories NVM11, NVM12, NVM13, and NVM14) of the plurality of non-volatile memories NVM11 to NVM24 may communicate with the storage controller 110 through a first channel CH1, and some (e.g., non-volatile memories NVM21, NVM22, NVM23, and NVM24) may communicate with the storage controller 110 through a second channel CH2. The present disclosure is not limited to the number of channels shown in FIG. 6.

In the plurality of non-volatile memories NVM11 to NVM24, the non-volatile memories NVM11 and NVM21 may constitute a first way WAY1, the non-volatile memories NVM12 and NVM22 may constitute a second way WAY2, the non-volatile memories NVM13 and NVM23 may constitute a third way WAY3, and the non-volatile memories NVM14 and NVM24 may constitute a fourth way WAY4. In some embodiments, the non-volatile memory device 120 may have a multi-way/multi-channel structure.

Figure 7:
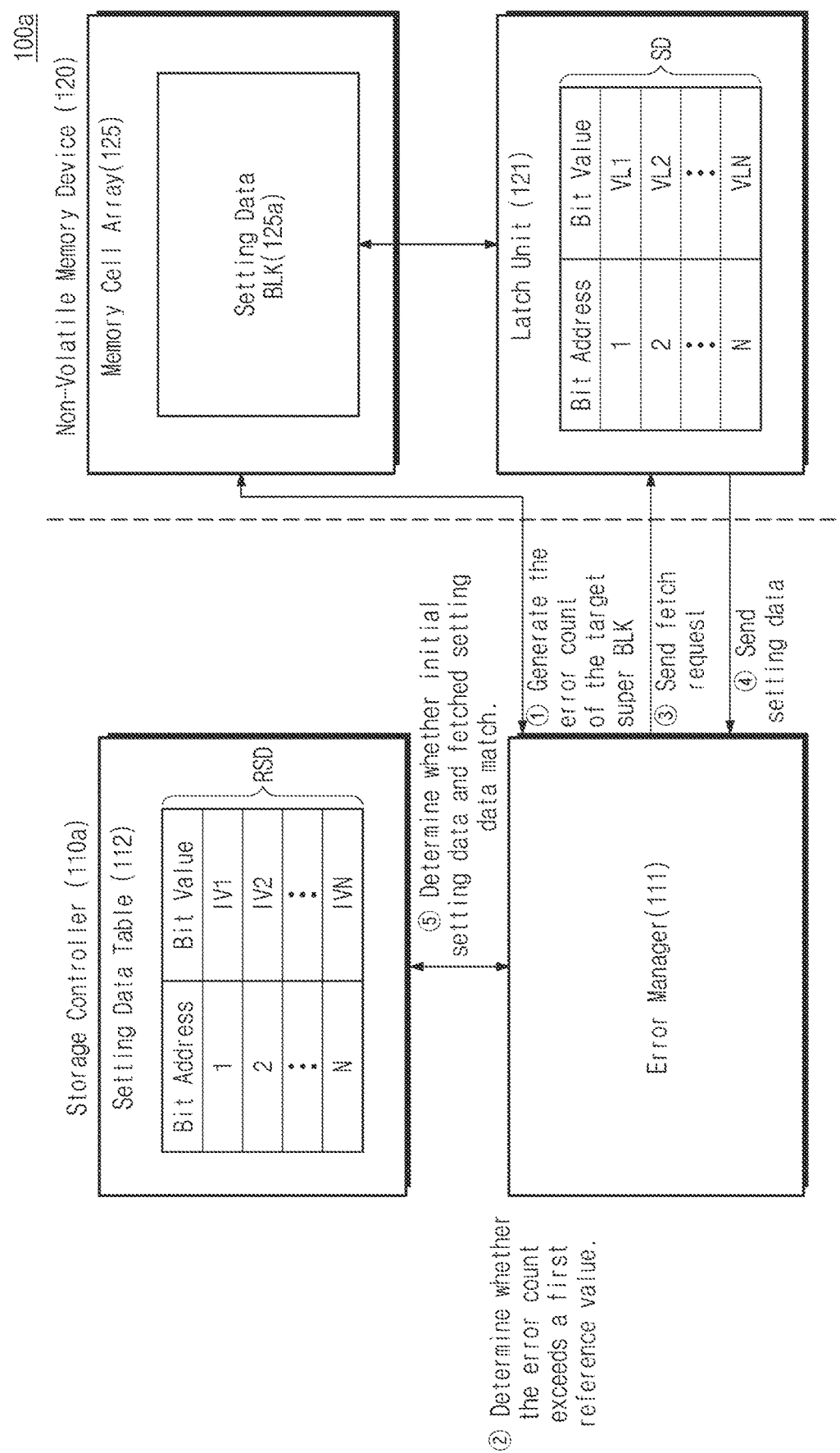
FIG. 7 is a block diagram describing a storage device according to some embodiments of the present disclosure.

In some embodiments, the error manager 111 may detect an error within data that is stored in the target super block that is targeted for the command received from the host and may generate the error count. When it is determined that the error count exceeds the first reference value, the error manager 111 may determine whether the soft error occurs in the latch unit 121, with reference to the setting data table 112. FIG. 7 is a diagram describing an error detection operation of a storage device according to some embodiments of the present disclosure. Referring to FIG. 7, the storage device 100a may include the storage controller 110a and the non-volatile memory device 120. The storage controller 110a and the non-volatile memory device 120 may respectively correspond to the storage controller 110a and the non-volatile memory device 120 of FIG. 5.

Below, the error detection operation of the storage device 100a according to some embodiments of the present disclosure will be described. For convenience of description and for brevity of drawing, some components may be omitted.

In a first operation ①, the error manager 111 may detect an error within data that is stored in the target super block targeted for the command received from the host and may generate the error count.

In some embodiments, the error manager 111 may determine whether there is a command received from a host during a reference time. The reference time may be an idle time. The error manager 111 may determine whether a second command is received from the host during the reference time from a reference time point at which a first command is received. When the second command is not received during the reference time from the reference time point, the error manager 111 may generate the error count.

In a second operation ②, the error manager 111 may determine whether the error count exceeds a first reference value. When the error count exceeds the first reference value, the error manager 111 may determine that the number of hard errors detected in memory cells corresponding to the target super block is more than that expected in the normal operation. When it is determined that the number of hard errors is more than that expected in the normal operation, the error manager 111 may determine whether the settings of memory cells are problematic. When the error count exceeds the first reference value, the error manager 111 may perform a third operation ③. In the third operation ③, the error manager 111 may send a fetch request to the latch unit 121. The fetch request may refer to a request that allows setting data SD in the latch unit 121 to be fetched to the error manager 111. In some embodiments, the error manager 111 may send the fetch request such that the fetched bits correspond to the major portion from among bits of the setting data SD, to the latch unit 121.

In a fourth operation ④, the latch unit 121 may send the setting data SD to the error manager 111 in response to the fetch request. In some embodiments, the latch unit 121 may send bits corresponding to the major portion from among the bits of the setting data SD to the error manager 111 in response to the fetch request.

In a fifth operation ⑤, the error manager 111 may determine whether the reference setting data RSD and the fetched setting data coincide or match with each other, with reference to the setting data table 112. When it is determined that the reference setting data RSD are not matched with the fetched setting data, the error manager 111 may determine that the soft error occurs in the latch unit 121.

In some embodiments, the error manager 111 may determine the second-type error bit, whose bit value is different from that of the reference setting data RSD, from the fetched setting data by comparing the reference setting data RSD and the fetched setting data for each bit. When the second-type error bit exists, the error manager 111 may determine that the soft error occurs in the latch unit 121.

In some embodiments, the error manager 111 may determine whether the reference setting data RSD and the fetched setting data coincide with each other, by comparing the major portion of the reference setting data RSD and the major portion of the fetched setting data for each bit.

Through the above error detection operation, when the error manager 111 determines that the soft error occurs in the latch unit 121, the error manager 111 may perform the error correction operation. This will be described in greater detail with reference to FIG. 10.

Figure 8:
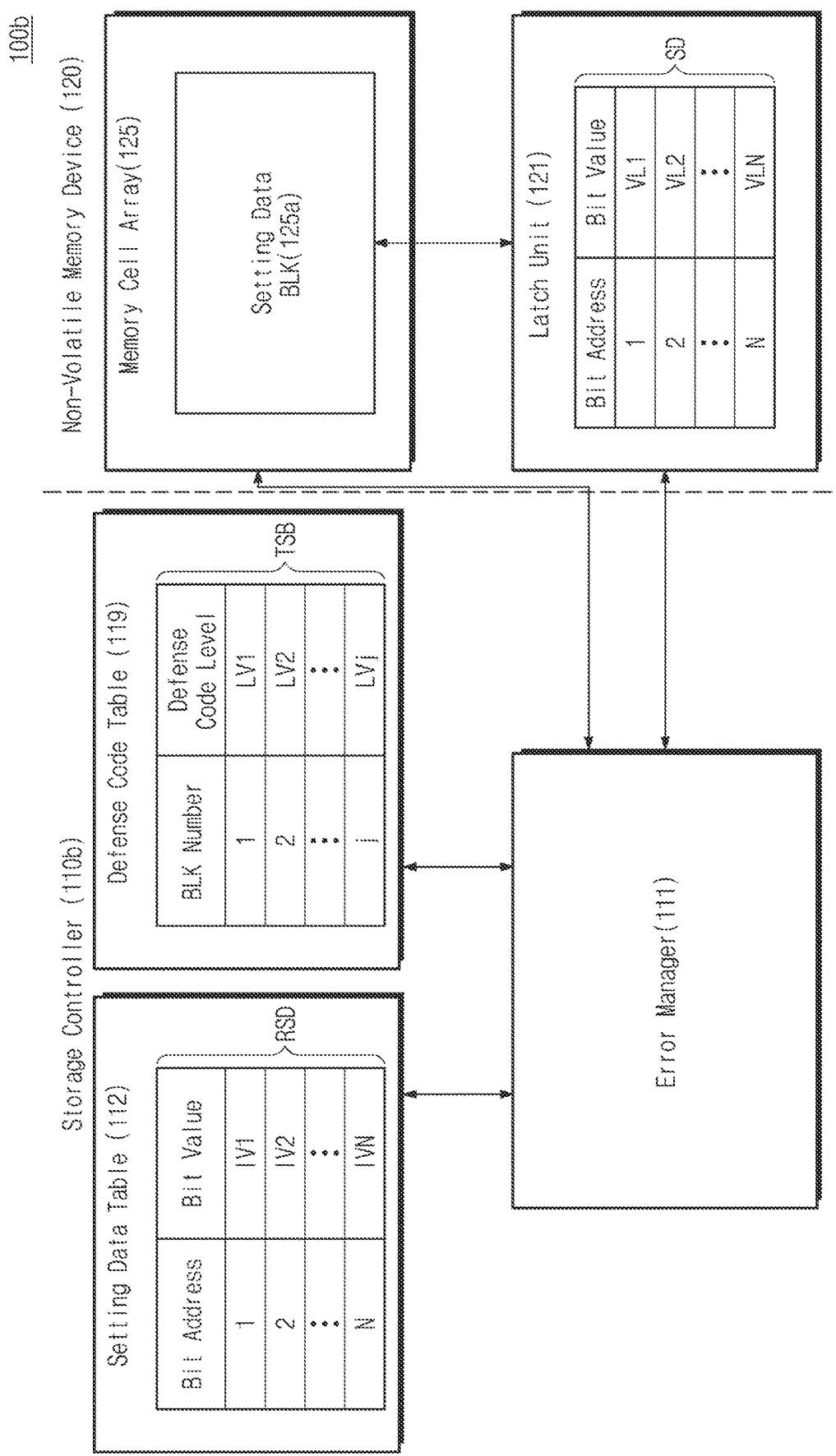
FIG. 8 is a diagram describing a super block according to some embodiments of the present disclosure.

FIG. 8 is a block diagram describing a storage device according to some embodiments of the present disclosure. Referring to FIG. 8, a storage device 100b may include a storage controller 110b and the non-volatile memory device 120.

The storage controller 110b may include the error manager 111, the setting data table 112, and a defense code table 119. The error manager 111 and the setting data table 112 may respectively correspond to the error manager 111 and the setting data table 112 of FIG. 5.

The defense code table 119 may manage information about a defense code of each of the memory blocks of the non-volatile memory device 120. The defense code may be used to perform a read retry operation on each of the memory blocks. The read retry operation may refer to an operation of determining whether an uncorrectable error occurs in a memory block, changing a read level of the memory block when the uncorrectable error occurs, and performing a read request. The defense code may be repeatedly executed for the read retry operation until the read error is corrected (e.g., completely corrected).

The defense code table 119 may manage defense code levels of the memory blocks in units of super block. As discussed above, the super block may refer to a group of memory blocks that are programmed at the same time by one programming request.

The defense code level may refer to the number of read retry operations that are performed for each memory block. Referring to the defense code table 119 of FIG. 8, defense code levels of memory blocks corresponding to a target super block (TSB) are illustrated. For example, when the read retry operation is performed on the first memory block six times, the defense code level LV1 of the first memory block may be "6". When the read retry operation is performed on the second memory block three times, the defense code level LV2 of the second memory block may be "3".

The error manager 111 may determine whether to send the fetch request to the latch unit 121, based on the defense code table 119.

In some embodiments, when at least one of a plurality of defense code levels LV1 to LVj included in the target super block exceeds a reference level, the error manager 111 may send the fetch request to the latch unit 121. The reference level may refer to the criterion for the error manager 111 to perform a comparison operation of the setting data in the latch unit 121 and the reference setting data RSD.

For example, when a defense code level having the greatest magnitude from among the plurality of defense code levels LV1 to LVj corresponding to the target super block (TSB) is "15" and the reference level is "7," the error manager 111 may send the fetch request to the latch unit 121.

In some embodiments, when a difference value is greater than a second reference value, the error manager 111 may send the fetch request to the latch unit 121. The difference value may refer to a difference between the smallest defense code level and the greatest defense code level among the plurality of defense code levels LV1 to LVj corresponding to the target super block. The second reference value may refer to the criterion for determining whether a memory block where a lot of hard errors occur especially is present in the memory blocks of the target super block.

The error manager 111 may calculate a difference between the smallest level and the greatest level among the defense code levels LV1 to LVj of the memory blocks included in the target super block and may generate a difference value. For example, when the greatest defense code level among the defense code levels LV1 to LVj corresponding to the target super block (TSB) is "15" and the smallest defense code level among the defense code levels LV1 to LVj is "7," the difference value may be "8." Because the difference value is "8" and the second reference value is "5," that is, because the difference value is greater than the second reference value, the error manager 111 may send the fetch request to the latch unit 121.

In some embodiments, the error manager 111 may calculate the difference value for each channel, in the target super block. Also, the error manager 111 may calculate the difference value for each way, in the target super block.

In the present disclosure, only the operation of determining whether to send the fetch request to the latch unit 121 based on the plurality of defense code levels LV1 to LVj corresponding to the target super block (TSB) is described above, but the present disclosure is not limited thereto. For example, whether to send the fetch request to the latch unit 121 may be determined based on defense code levels of a plurality of super blocks included in the non-volatile memory device 120.

As described above, as the error manager 111 may determine whether to send the fetch request to the latch unit 121 based on the defense code table 119, the error manager 111 may determine whether to perform the error detection operation based on how many errors occur in the memory blocks. That is, when numerous errors occur in memory cells during the read operation or the write operation, it may be suspected that the settings of the memory cells are problematic, the error manager 111 may detect whether an error is present in the setting data of the latch unit 121.

Figure 9:
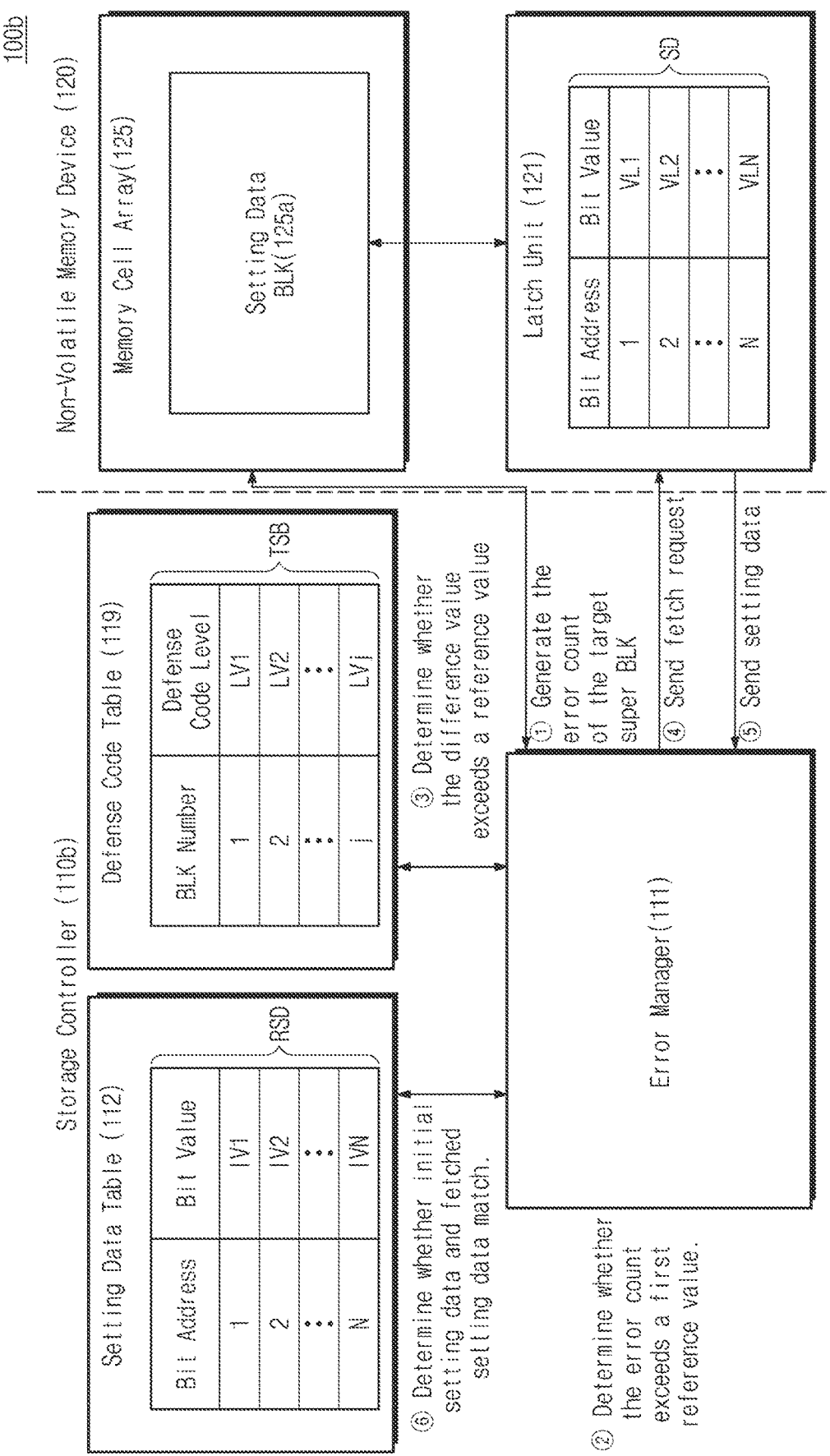
FIG. 9 is a diagram describing an error detection operation of a storage device according to some embodiments of the present disclosure.

FIG. 9 is a diagram describing an error detection operation of a storage device according to some embodiments of the present disclosure. Referring to FIG. 9, the storage device 100b may include the storage controller 110b and the non-volatile memory device 120. The storage controller 110b and the non-volatile memory device 120 may respectively correspond to the storage controller 110b and the non-volatile memory device 120 of FIG. 8. The defense code table 119 illustrated in FIG. 9 may manage the defense code levels of the target super block TSB described with reference to FIG. 6. For example, the first level LV1 may be a defense code level of the memory block BLK11_1; the second level LV2 may be a defense code level of the memory block BLK12_2; the j-th level LVj may be a defense code level of the memory block BLK24_K. An example where the defense code table 119 manages the defense code levels of the target super block TSB is illustrated in FIG. 9, but the present disclosure is not limited thereto. For example, the defense code table 119 may manage defense code levels of a plurality of super blocks.

Below, the error detection operation of the storage device 100b according to some embodiments of the present disclosure will be described. For convenience of description and for brevity of drawing, some components may be omitted.

In a first operation ①, the error manager 111 may detect an error within data that is stored in the target super block targeted for the command received from the host and may generate the error count.

In a second operation ②, the error manager 111 may determine whether the error count exceeds the first reference value. When the error count exceeds the first reference value, the error manager 111 may determine that the number of hard errors detected in memory cells corresponding to the target super block TSB is more than that in the normal operation. When it is determined that the number of hard errors is more than that in the normal operation, the error manager 111 may determine whether the settings of memory cells are problematic. When the error count exceeds the first reference value, the error manager 111 may perform a third operation ③. In the third operation ③, the error manager 111 may determine whether to send the fetch request with reference to the defense code table 119. In some embodiments, the error manager 111 may determine whether to send the fetch request, based on whether the greatest level for each super block exceeds the reference level. For example, when the error manager 111 determines that the greatest defense code level among the plurality of defense code levels LV1 to LVj corresponding to the target super block TSB exceeds the reference level, the error manager 111 may perform a fourth operation ④.

In some embodiments, the error manager 111 may determine whether to send the fetch request, based on whether the difference value exceeds the second reference value. For example, the error manager 111 may calculate a difference between the greatest defense code level and the smallest defense code level among the defense code levels LV1 to LVj corresponding to the target super block TSB and may generate the difference value. When it is determined that the difference value exceeds the reference level, the error manager 111 may perform the fourth operation ④.

In the fourth operation ④, the error manager 111 may send the fetch request to the latch unit 121. The fetch request may refer to a request that allows setting data SD in the latch unit 121 to be fetched to the error manager 111. In some embodiments, the error manager 111 may send the fetch request such that the fetched bits correspond to the major portion from among bits of the setting data SD, to the latch unit 121.

In a fifth operation ⑤, the latch unit 121 may send the setting data SD to the error manager 111 in response to the fetch request. In some embodiments, the latch unit 121 may send bits corresponding to the major portion from among the bits of the setting data SD to the error manager 111 in response to the fetch request.

In a sixth operation ⑥, the error manager 111 may determine whether the reference setting data RSD and the fetched setting data are matched, with reference to the setting data table 112. When it is determined that the reference setting data RSD are not matched with the fetched setting data, the error manager 111 may determine that the soft error occurs in the latch unit 121.

Through the above error detection operation, when the error manager 111 determines that the soft error occurs in the latch unit 121, the error manager 111 may send a correction request to the error manager 111. The error manager 111 may perform the correction operation based on the correction request. This will be described in greater detail with reference to FIG. 10.

Figure 10:
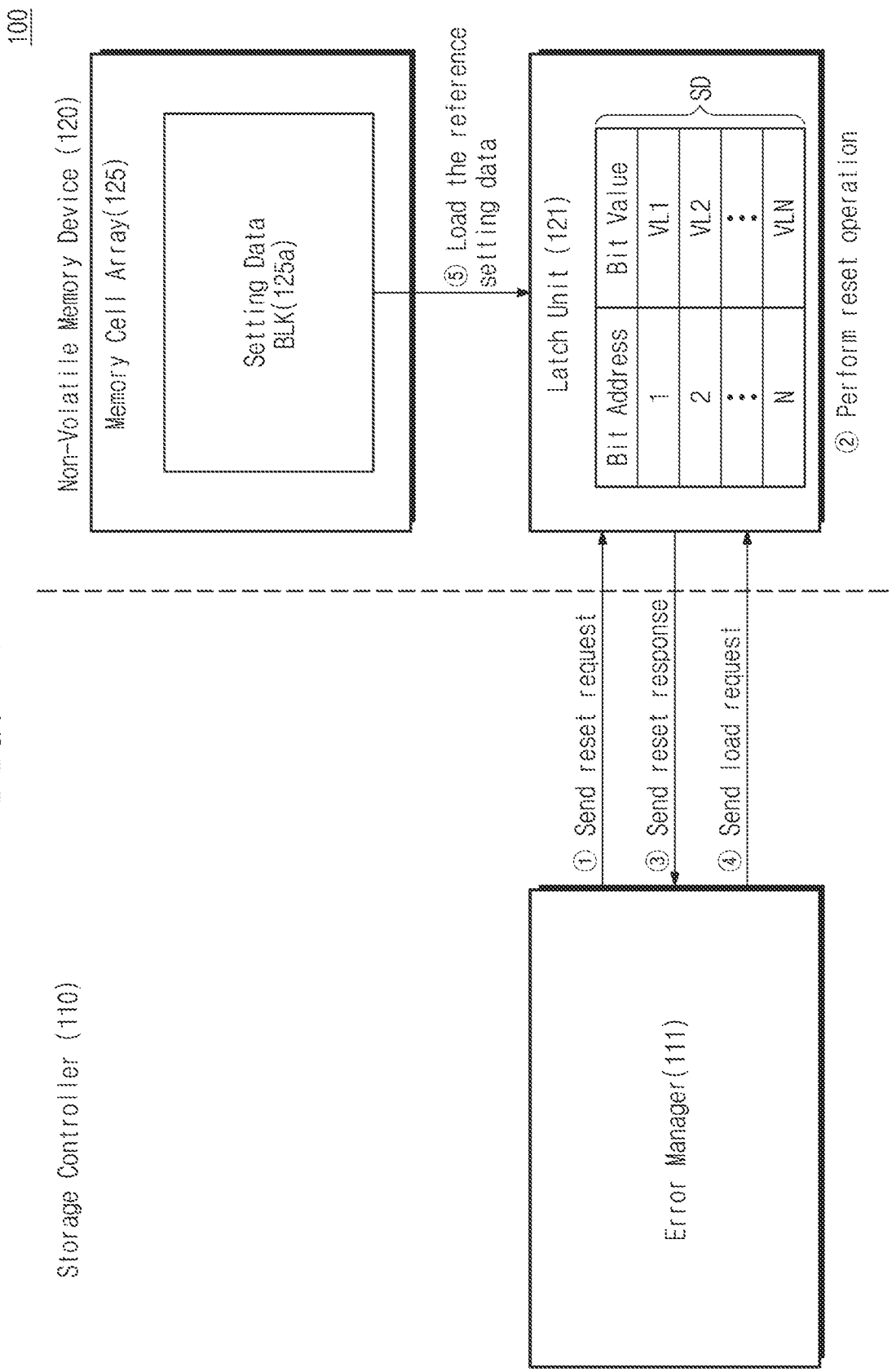
FIG. 10 is a diagram describing an error correction operation of a storage device according to some embodiments of the present disclosure.

FIG. 10 is a diagram describing an error correction operation of a storage device according to some embodiments of the present disclosure. Referring to FIG. 10, the storage device 100 may include the storage controller 110 and the non-volatile memory device 120. The storage controller 110 may correspond to the storage controller 110 of FIG. 5 or the storage controller 110a of FIG. 7. The non-volatile memory device 120 may correspond to the non-volatile memory device 120 of FIG. 5 or the non-volatile memory device 120 of FIG. 7.

Below, the error correction operation of the storage device 100 according to some embodiments of the present disclosure will be described. For convenience of description and for brevity of drawing, some components may be omitted.

In a first operation ①, the error manager 111 may send a reset request to the latch unit 121. In some embodiments, when the error manager 111 determines, through the error detection operation, that the soft error occurs in the latch unit 121, the error manager 111 may send the reset request to the latch unit 121.

In some embodiments, the error manager 111 may send error bit information together with the reset request. For example, when the second bit value of the reference setting data and the second bit value VL2 of the fetched setting data do not match with each other, the error bit information may include a bit address associated with the second bit.

In a second operation ②, the latch unit 121 may perform the reset operation. The latch unit 121 may delete the setting data SD present in the latch unit 121. In some embodiments, based on the error bit information, the latch unit 121 may delete a bit value corresponding to the second-type error bit from among bit values of the setting data SD. For example, when the error bit information includes the bit address associated with the second bit, the latch unit 121 may delete the second bit value VL2. Stated differently, in some embodiments the latch unit 121 may delete only a portion of the setting data SD present in the latch unit 121.

In some embodiments, the latch unit 121 may delete the major portion of the setting data SD. For example, when the major portion is the first portion, the latch unit 121 may delete the first to L-th bits of the setting data SD.

When the reset operation is completed, in a third operation ③, the latch unit 121 may send a reset response to the error manager 111. In a fourth operation ④, the error manager 111 may send the load request to the latch unit 121 in response to the reset response.

In a fifth operation ⑤, the latch unit 121 may load the reference setting data RSD present in the setting data block 125a to the latch unit 121, based on the load request.

In some embodiments, the latch unit 121 may load bit values corresponding to the major portion of the reference setting data RSD. For example, when the major portion is the first portion, the first to L-th bits of the reference setting data RSD may be loaded.

In some embodiments, the latch unit 121 may load a bit value corresponding to the error bit information from among the bit values of the reference setting data RSD. For example, when the error bit information includes the bit address of the second bit, the second bit value of reference setting data RSD may be loaded. Stated differently, in some embodiments, the latch unit 121 may load one or more bits from the reference setting data RSD that correspond to bits deleted during the reset operation.

Through the above error correction operation, the latch unit 121 may store the same data as the reference setting data RSD present in the setting data block 125a. Accordingly, a bit value flipped by the soft error from among the bit values of the setting data SD may be corrected.

Figure 11:
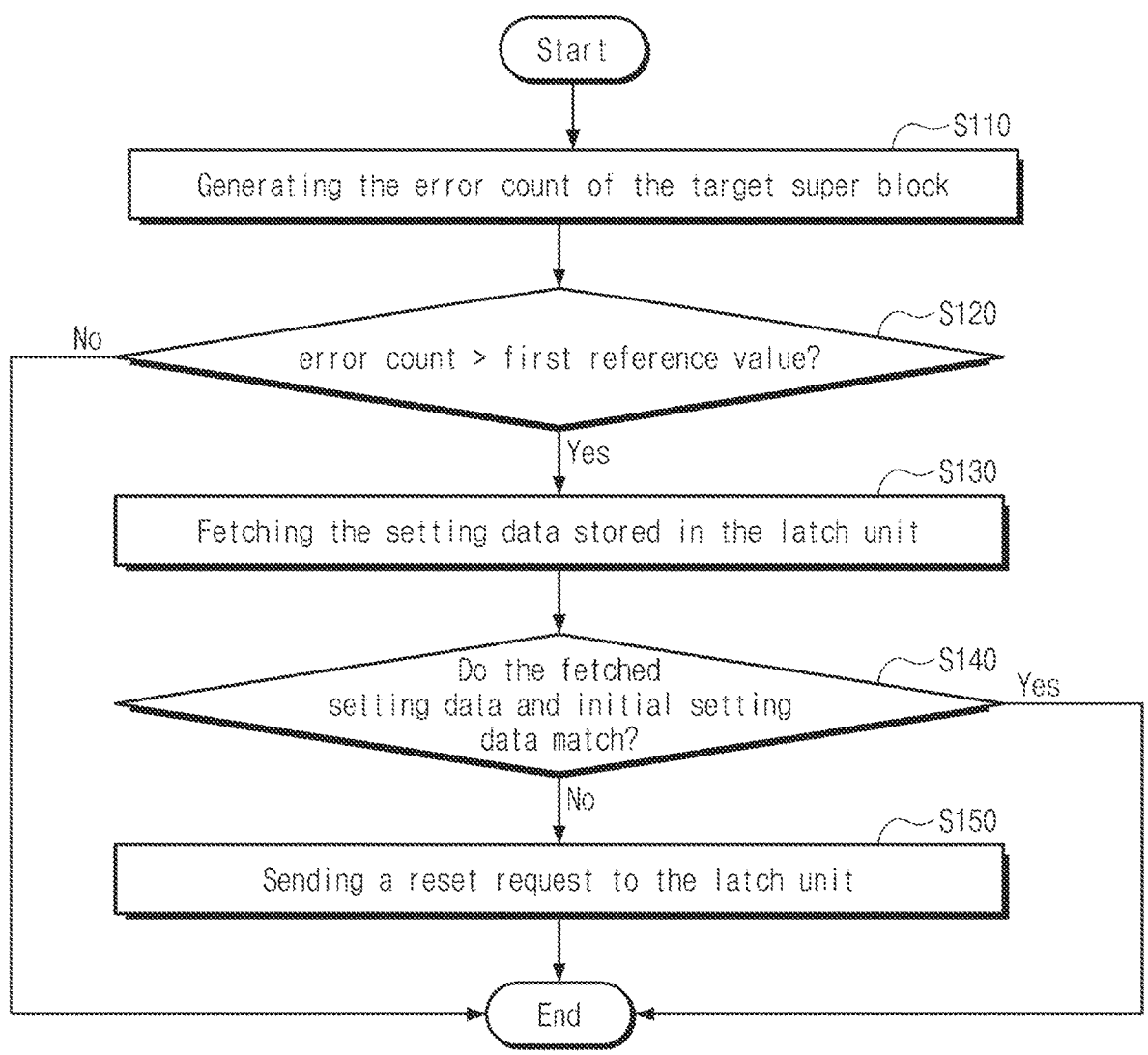
FIG. 11 is a flowchart describing an operating method of a storage controller according to some embodiments of the present disclosure.

FIG. 11 is a flowchart describing an operating method of a storage controller according to some embodiments of the present disclosure. Referring to FIG. 11, a storage controller may communicate with a host and a non-volatile memory device. The storage controller may correspond to the storage controller 110 described with reference to FIGS. 1, 2, 5, and 6.

In operation S110, the storage controller may detect an error within data that is stored in a target super block targeted for a command received from a host and may generate an error count.

In operation S120, the storage controller may determine whether the error count exceeds the first reference value. When it is determined that the error count exceeds the first reference value, the storage controller may perform operation S130. When it is determined that the error count does not exceed the first reference value, the storage controller may terminate the error detection operation.

In operation S130, the storage controller unit may fetch setting data stored in a latch unit. The latch unit may constitute latch circuits included in the non-volatile memory device. The latch unit may store setting data of memory cells of the non-volatile memory device. In some embodiments, the storage controller may fetch the first to N-th bits of the setting data. In some embodiments, the storage controller may fetch bits corresponding to an indicated major portion of the setting data.

In operation S140, the storage controller may determine whether the fetched setting data are matched with the reference setting data. When it is determined that the fetched setting data does not match the reference setting data, the storage controller may perform operation S150. When it is determined that the fetched setting data are matched with the reference setting data, the storage controller may terminate the error detection operation.

In operation S150, the storage controller may send the reset request to the latch unit. The reset request may refer to a request for initializing the setting data stored in the latch unit.

Figure 12:
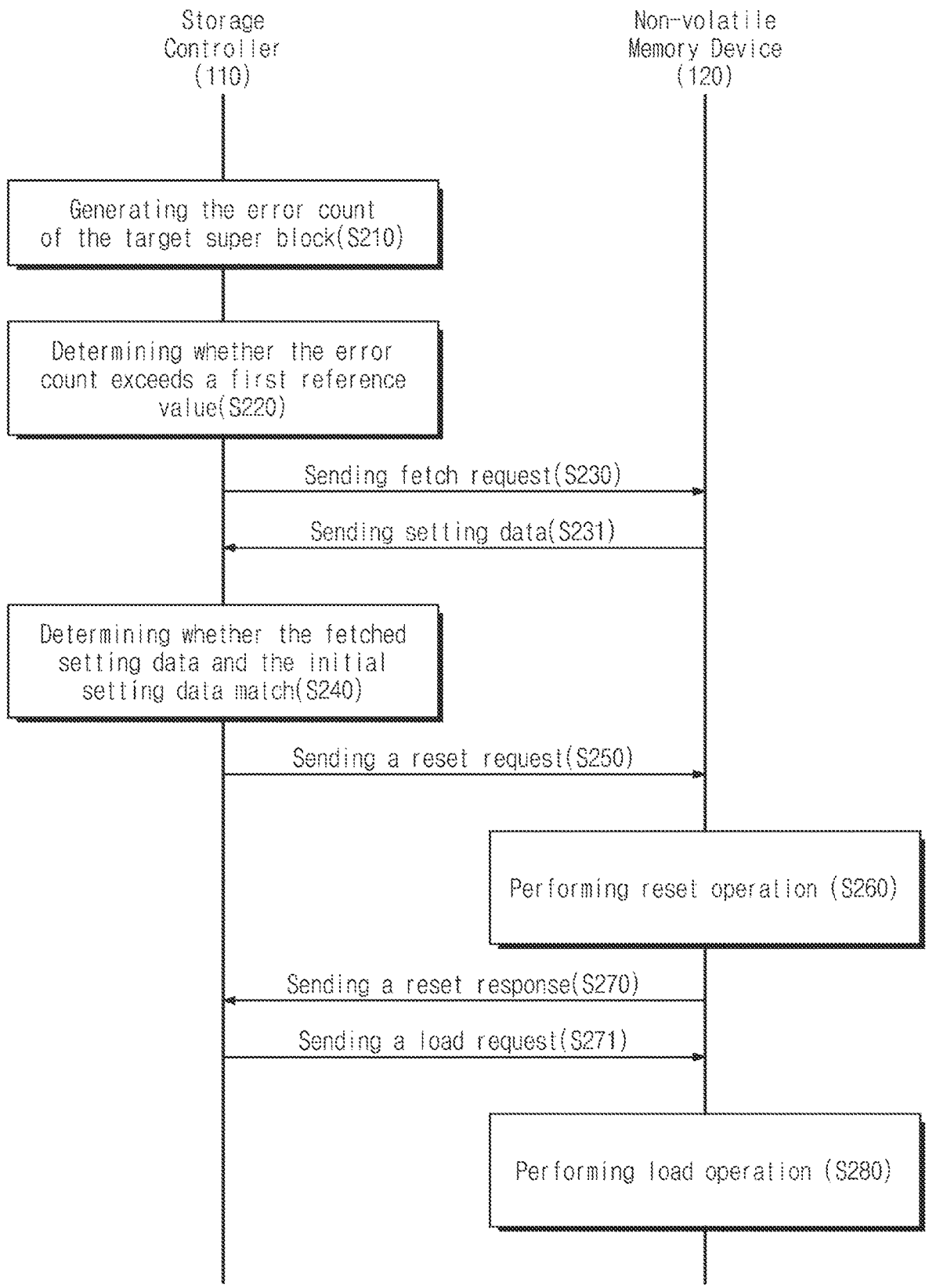
FIG. 12 is a flowchart describing an operating method of a storage device according to some embodiments of the present disclosure.

FIG. 12 is a flowchart describing an operating method of a storage device according to some embodiments of the present disclosure. Referring to FIG. 12, the storage controller 110 and the non-volatile memory device 120 may communicate with each other. The storage controller 110 may correspond to the storage controller 110 of FIGS. 1 and 2 and the storage controller 110a of FIGS. 5 and 6. The non-volatile memory device 120 may correspond to the non-volatile memory device 120 of FIGS. 1, 2, 5, and 6.

In operation S210, the storage controller 110 may detect an error of data stored in a target super block of the non-volatile memory device 120 and may generate an error count.

In operation S220, the storage controller 110 may determine whether the error count exceeds the first reference value. When it is determined that the error count exceeds the first reference value, the storage controller may perform operation S230.

In operation S230, the storage controller 110 may send the fetch request to the non-volatile memory device 120. In operation S231, the non-volatile memory device 120 may send the setting data present in the latch unit to the storage controller 110.

In operation S240, the storage controller 110 may determine whether the fetched setting data are matched with the reference setting data. When it is determined that the fetched setting data are not matched with the reference setting data, the storage controller 110 may perform operation S250.

In operation S250, the storage controller 110 may send the reset request to the non-volatile memory device 120.

In operation S260, the non-volatile memory device 120 may perform the reset operation in response to the reset request. The non-volatile memory device 120 may initialize the setting data present in the latch unit in response to the reset request.

In operation S270, the non-volatile memory device 120 may send the reset response to the storage controller 110 based on that the reset operation is performed.

In operation S271, the storage controller 110 may send the load request to the non-volatile memory device 120 in response to the reset response.

In operation S280, the non-volatile memory device 120 may perform the load operation in response to the load request. The non-volatile memory device 120 may load the reference setting data present in a setting data block to the latch unit.

Figure 13:
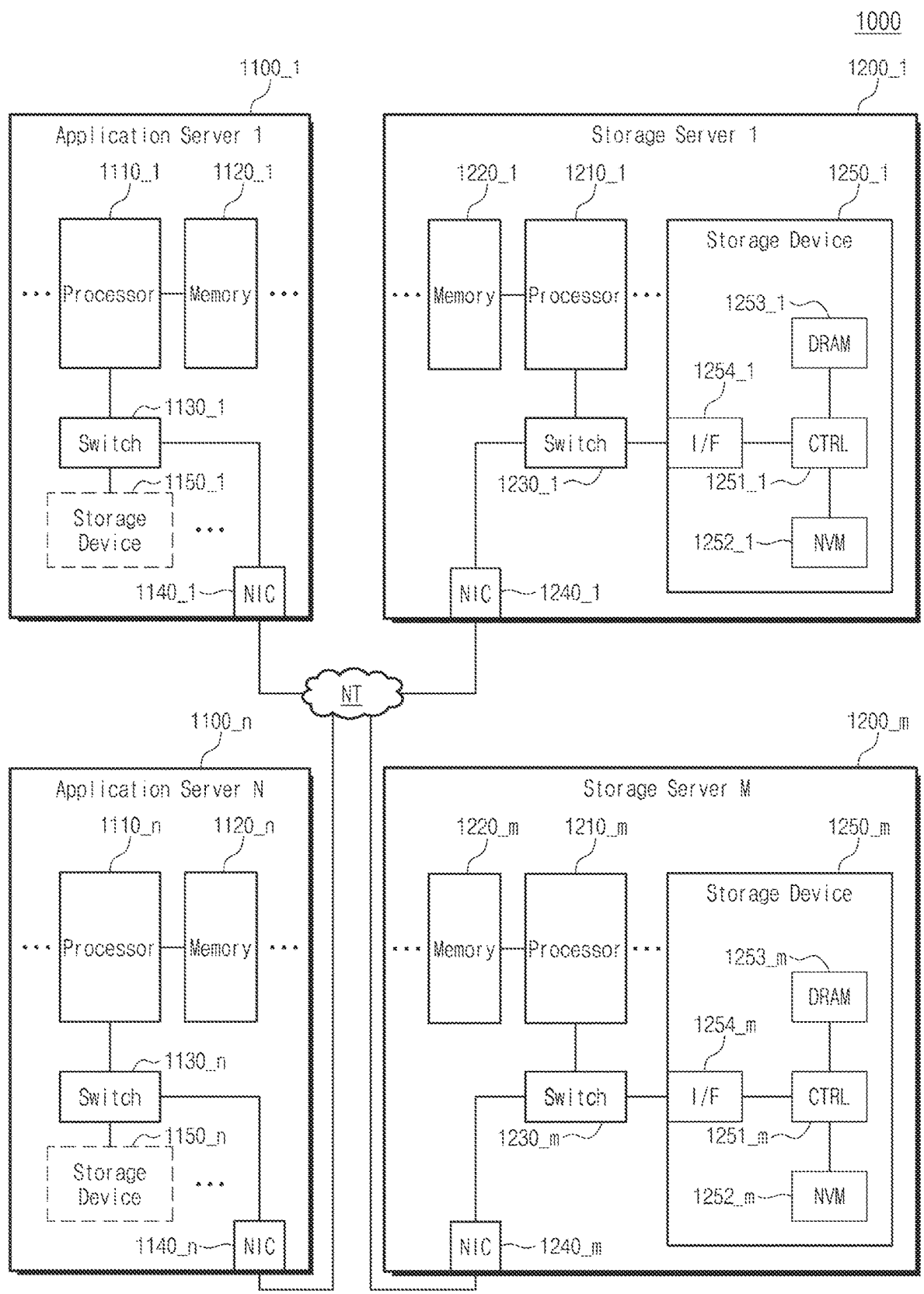
FIG. 13 is a block diagram illustrating a data center to which a storage device according to some embodiments of the present disclosure may be applied.

FIG. 13 is a block diagram illustrating a data center to which a storage device according to some embodiments of the present disclosure may be applied. A data center 1000 may be a facility that maintains and manages various data and provides various services for various data and may be referred to as a "data storage center." The data center 1000 may be a system used for the operation of a search engine or a database and/or may be a computing system that is used in various institutions. The data center 1000 may include a plurality of application servers 1100_1 to 1100_n and a plurality of storage servers 1200_1 to 1200_m. The number of application servers 1100_1 to 1100_n and the number of storage servers 1200_1 to 1200_m may be variously changed or modified.

Below, for convenience of description, the first storage server 1200_1 will be described as an example. Each of the remaining storage servers 1200_2 to 1200_m and the plurality of application servers 1100_1 to 1100_n may be similar in structure to the firmware release server 1100.

The first storage server 1200_1 may include a processor 1210_1, a memory 1220_1, a switch 1230_1, a network interface connector (NIC) 1240_1, and a storage device 1250_1. The processor 1210_1 may control an overall operation of the first storage server 1200_1. The memory 1220_1 may store various instructions or data under control of the processor 1210_1. The processor 1210_1 may access the memory 1220_1 for the purpose of executing various instructions or processing various data. In some embodiments, the memory 1220_1 may include at least one of various kinds of memory devices such as DDR SDRAM (Double Data Rate Synchronous DRAM), HBM (High Bandwidth Memory), HMC (Hybrid Memory Cube), DIMM (Dual In-line Memory Module), Optane DIMM, and NVDIMM (Non-Volatile DIMM).

In some embodiments, the number of processors 1210_1 included in the first storage server 1200_1 and the number of memories 1220_1 included therein may be variously changed or modified. In some embodiments, the processor 1210_1 and the memory 1220_1 included in the first storage server 1200_1 may constitute a processor-memory pair, and the number of processor-memory pairs included in the first storage server 1200_1 may be variously changed or modified. In some embodiments, the number of processors 1210_1 included in the first storage server 1200_1 and the number of memories 1220_1 included therein may be different from each other. The processor 1210_1 may include a single core processor or a multi-core processor.

Under control of the processor 1210_1, the switch 1230_1 may selectively connect the processor 1210_1 and the storage device 1250_1 or may selectively connect the NIC 1240_1 and the storage device 1250_1.

The NIC 1240_1 may be configured to connect the first storage server 1200_1 with a network NT. The NIC 1240_1 may include a network interface card, a network adapter, etc. The NIC 1240_1 may be connected with the network NT by a wired interface, a wireless interface, a Bluetooth interface, an optical interface, or the like. The NIC 1240_1 may include an internal memory, a digital signal processor (DSP), a host bus interface, or the like and may be connected with the processor 1210_1 or the switch 1230_1 through the host bus interface. In some embodiments, the host bus interface may include at least one of various interfaces such as an ATA (Advanced Technology Attachment) interface, an SATA (Serial ATA) interface, an e-SATA (external SATA) interface, an SCSI (Small Computer Small Interface) interface, an SAS (Serial Attached SCSI) interface, a PCI (Peripheral Component Interconnection) interface, a PCIe (PCI express) interface, an NVMe (NVM express) interface, an IEEE 1394 interface, an USB (Universal Serial Bus) interface, an SD (Secure Digital) card interface, an MMC (Multi-Media Card) interface, an eMMC (embedded Multi-Media Card) interface, an UFS (Universal Flash Storage) interface, an eUFS (embedded Universal Flash Storage) interface, and/or a CF (Compact Flash) card interface. In some embodiments, the NIC 1240_1 may be integrated with at least one of the processor 1210_1, the switch 1230_1, and the storage device 1250_1.

Under control of the processor 1210_1, the storage device 1250_1 may store data or may output the stored data. The storage device 1250_1 may include a controller 1251_1, a nonvolatile memory 1252_1, a DRAM 1253_1, and an interface 1254_1.

The controller 1251_1 may control an overall operation of the first storage device 1250_1. In some embodiments, the controller 1251_1 may detect a soft error of setting data stored in a latch unit of the nonvolatile memory 1252_1 and may correct the detected soft error. For example, the controller 1251_1 may determine whether the setting data stored in the latch unit are matched with reference setting data; when the setting data stored in the latch unit are not matched with the setting data or does not match the setting data, the controller 1251_1 may load the reference setting data stored in a setting data block of the nonvolatile memory 1252_1 to the latch unit.

The DRAM 1253_1 may be configured to store temporarily data that is to be stored in the nonvolatile memory 1252_1 or data that is read from the nonvolatile memory 1252_1. The DRAM 1253_1 may be configured to store various data (e.g., meta data and mapping data) used in the operation of the controller 1251_1. The interface 1254_1 may provide the physical connection between the controller 1251_1 and the processor 1210_1, the switch 1230_1, or the NIC 1240_1. In some embodiments, the interface 1254_1 may be implemented in the direct attached storage (DAS) manner in which it is possible to connect directly to the storage device 1250_1 through a dedicated cable. In some embodiments, the interface 1254_1 may be based on at least one of various interfaces described through the above host bus interface.

The above components of the first storage server 1200_1 may be provided as an example, and the present disclosure is not limited thereto. The above components of the first storage server 1200_1 may be applied to each of the remaining storage servers 1200_2 to 1200_m or the plurality of application servers 1100_1 to 1100_n. In some embodiments, in each of the plurality of application servers 1100_1 to 1100_n, a storage device 1150_1 may be selectively omitted.

The plurality of application servers 1100_1 to 1100_n and the plurality of storage servers 1200_1 to 1200_m may communicate with each other over the network NT. The network NT may be implemented by using a Fibre channel (FC) or an Ethernet. In some embodiments, the FC may be a medium that is used in high-speed data transmission and may use an optical switch that provides high performance/high availability. The storage servers 1200_1 to 1200_m may be provided as file storage, block storage, or object storage depending on an access manner of the network NT.

In some embodiments, the network NT may be a storage-dedicated network such as a storage area network (SAN). For example, the SAN may be a FC-SAN that uses a FC network and is implemented depending on a FC protocol (FCP). Alternatively, the SAN may be a IP-SAN that uses a TCP/IP network and is implemented depending on an iSCSI (SCSI over TCP/IP or Internet SCSI). In some embodiments, the network NT may be a legacy network such as a TCP/IP network. For example, the network NT may be implemented depending on the following protocol: FCoE (FC over Ethernet), NAS (Network Attached Storage), or NVMe-oF (NVMe over Fabrics).

In some embodiments, at least one of the plurality of application servers 1100_1 to 1100_n may be configured to access at least another of the plurality of application servers 1100_1 to 1100_n over the network NT or to access at least one of the plurality of storage servers 1200_1 to 1200_m over the network NT.

For example, the first application server 1100_1 may store data requested by the user or client in at least one of the plurality of storage servers 1200_1 to 1200_m over the network NT. Alternatively, the first application server 1100_1 may obtain the data requested by the user or client from at least one of the plurality of storage servers 1200_1 to 1200_m over the network NT. In some embodiments, the first application server 1100_1 may be implemented with a web server, a database management system (DBMS), etc.

That is, a processor 1110_1 of the first application server 1100_1 may access a memory 1120_n or a storage device 1150_n of another application server (e.g., 1100_n) over the network NT. Alternatively, the processor 1110_1 of the first application server 1100_1 may access the memory 1220_1 or the storage device 1250_1 of the first storage server 1200_1 over the network NT. As such, the first application server 1100_1 may perform various operations for data stored in the remaining application servers 1100_2 to 1100_n or the plurality of storage servers 1200_1 to 1200_m. For example, the first application server 1100_1 may execute or issue an instruction for moving or copying data between the remaining application servers 1100_2 to 1100_n or between the plurality of storage servers 1200_1 to 1200_m. In some embodiments, data to be moved or copied may be transferred from storage devices 1250_1 to 1250_m of the storage servers 1200_1 to 1200_m to memories 1120_1 to 1120_n of the application servers 1100_1 to 1100_n directly or through memories 1220_1 to 1220_m of the storage servers 1200_1 to 1200_m. The data that are transferred over the network NT may be data that are encrypted for security or privacy.

In some embodiments, each of the storage devices 1150_1 to 1150_n and 1250_1 to 1250_m may be the storage device described with reference to FIGS. 1 to 12 and may be configured to perform various error detection operations and various error correction operations. Each of the storage devices 1150_1 to 1150_n and 1250_1 to 1250_m may detect the soft error as described with reference to FIGS. 1 to 12 and may correct the detected soft error.

According to some embodiments of the present disclosure, a storage controller configured to perform a reset operation by using setting data, an operating method of the storage controller, and an operating method of a storage device including the storage controller are provided.

The storage controller according to the present disclosure may improve the reliability of the storage device by detecting and correcting the soft error caused in a latch unit that stores the setting data.

While the present disclosure has been described with reference to some examples of embodiments thereof, it will be apparent to those of ordinary skill in the art that various changes and modifications may be made thereto without departing from the scope of the present disclosure as set forth in the following claims.

What is claimed is:

1. An operating method of a storage controller configured to communicate with a host and with a non-volatile memory device, the method comprising:
   generating an error count by counting a number of first-type error bits of a target super block of the non-volatile memory device;
   determining whether the error count exceeds a first reference value;
   fetching setting data from a latch unit of the non-volatile memory device to provide fetched setting data when the error count exceeds the first reference value;
   determining whether reference setting data of a setting table are matched with the fetched setting data, the reference setting data indicating information about a designed operating environment of the non-volatile memory device; and
   providing a reset request to the latch unit when the reference setting data does not match the fetched setting data,
   wherein determining whether the reference setting data of the setting table are matched with the fetched setting data includes determining whether an indicated major portion of the reference setting data matches a portion of the fetched setting data corresponding to the indicated major portion of the reference setting data.

2. The method of claim 1, further comprising:
   receiving a reset response from the latch unit responsive to providing the reset request to the latch unit; and
   sending a load request to the latch unit, based on the receiving of the reset response,
   wherein the load request is configured to cause the non-volatile memory device to load the reference setting data into the latch unit.

3. The method of claim 1, wherein the determining whether the reference setting data of the setting table are matched with the fetched setting data comprises:
   comparing the reference setting data and the fetched setting data on a bit-by-bit basis to determine an error bit of the fetched setting data having a bit value that is different from a corresponding bit of the reference setting data.

4. The method of claim 3, wherein the providing the reset request to the latch unit based on that the reference setting data does not match the fetched setting data includes:
   providing an address of the error bit and the reset request to the latch unit,
   wherein the reset request is configured to cause the latch unit to initialize a bit of the setting data corresponding to the address.

5. The method of claim 3, further comprising:
   receiving a reset response from the latch unit responsive to providing the reset request to the latch unit; and
   sending an address of the error bit and a load request to the latch unit, based on the receiving of the reset response,
   wherein the load request is configured to cause the latch unit to load a bit corresponding to the address from the reference setting data.

6. The method of claim 1, wherein the reset request is configured to cause the latch unit to delete the major portion of the setting data from the latch unit.

7. The method of claim 1, further comprising:
   receiving a reset response from the latch unit responsive to providing the reset request to the latch unit; and
   sending a load request to the latch unit, based on receiving the reset response, wherein the load request is configured to cause the non-volatile memory device to load the major portion of the reference setting data into the latch unit.

8. The method of claim 1, wherein the generating the error count by counting the number of first-type error bits of the target super block of the non-volatile memory device includes:
  receiving a first command from the host at a first reference time point;
  determining whether a second command is received from the host during a reference time following the first reference time point; and
  generating the error count by counting the number of the first-type error bits of the target super block, based on determining that the second command is not received.

9. The method of claim 1, wherein the fetching the setting data from the latch unit of the non-volatile memory device based on determining that the error count exceeds the first reference value includes:
  based on determining that the error count exceeds the first reference value, determining whether a first level from among a plurality of defense code levels corresponding to the target super block of the non-volatile memory device exceeds a reference level; and
  fetching the setting data from the latch unit, based on determining that the first level exceeds the reference level.

10. The method of claim 1, wherein the fetching the setting data from the latch unit of the non-volatile memory device based on determining that the error count exceeds the first reference value includes:
  calculating a difference value by calculating a difference between a highest defense code level and a lowest defense code level among a plurality of defense code levels corresponding to the target super block of the non-volatile memory device;
  determining whether the difference value exceeds a second reference value; and
  fetching the setting data to the latch unit, based on determining that the difference value exceeds the second reference value.

11. The method of claim 1, wherein the fetching the setting data from the latch unit of the non-volatile memory device based on determining that the error count exceeds the first reference value includes:
  calculating a plurality of difference values by calculating a difference between highest and lowest defense code levels for each way corresponding to the target super block of the non-volatile memory device;
  determining whether at least one of the plurality of difference values exceeds a second reference value; and
  fetching the setting data from the latch unit, based on determining that the at least one of the plurality of difference values exceeds the second reference value.

12. The method of claim 1, wherein the fetching of the setting data from the latch unit of the non-volatile memory device based on determining that the error count exceeds the first reference value includes:
  calculating a plurality of difference values by calculating a difference between highest and lowest defense code levels for each channel corresponding to the target super block of the non-volatile memory device;
  determining whether at least one of the plurality of difference values exceeds a second reference value; and
  fetching the setting data from the latch unit, based on determining that the at least one of the plurality of difference values exceeds the second reference value.

13. The method of claim 1, wherein the information about the operating environment includes at least one of direct current (DC) level information, verification voltage level information, and bad block information of the non-volatile memory device.

14. The method of claim 1, wherein the latch unit includes a plurality of E-fuse latches.

15. The method of claim 1, further comprising:
  determining that a soft error has occurred in the non-volatile memory device, based on the determining that the reference setting data does not match the fetched setting data.

16. A storage controller, comprising:
  an error manager; and
  a setting data table including reference setting data,
  wherein the error manager is configured:
  to generate an error count by counting a number of first-type error bits of a target super block of a non-volatile memory device controlled by the storage controller;
  to determine whether the error count exceeds a first reference value;
  to fetch setting data from a latch unit of the non-volatile memory device to provide fetched setting data when the error count exceeds the first reference value;
  to determine whether the reference setting data matches the fetched setting data;
  to provide a reset request to the latch unit when the reference setting data does not match the fetched setting data;
  to receive a reset response from the latch unit; and
  to send a load request to the latch unit, based on receiving the reset response,
  wherein the load request is configured to cause the reference setting data to be loaded into the latch unit, and
  wherein the reference setting data indicate information about a designed operating environment of the non-volatile memory device.

17. The storage controller of claim 16, further comprising:
  a defense code table configured to manage a plurality of defense code levels corresponding to a target super block of the non-volatile memory device,
  wherein the error manager is configured to:
  based on determining that the error count exceeds the first reference value, determine whether at least one of a plurality of defense code levels corresponding to the target super block exceeds a reference level, with reference to the defense code table; and
  fetch the setting data from the latch unit, based on determining that the at least one of the plurality of defense code levels corresponding to the target super block exceeds the reference level.

18. An operating method of a storage device configured to communicate with a host, the storage device including a storage controller and a non-volatile memory device, the method comprising:
  generating, by the storage controller, an error count by counting a number of first-type error bits of a target super block of the non-volatile memory device;
  determining, by the storage controller, whether the error count exceeds a first reference value;
  transmitting, by the storage controller, a fetch request to a latch unit of the non-volatile memory device, based on determining that the error count exceeds the first reference value;

providing, by the non-volatile memory device, setting data of the latch unit to the storage controller;

determining, by the storage controller, whether reference setting data matches the setting data, the reference setting data indicating information about a designed operating environment of the non-volatile memory device; and providing, by the storage controller, a reset request to the latch unit, based on determining that the reference setting data does not match the setting data, wherein generating the error count by the storage controller includes:
- receiving a first command from the host at a first reference time point;
- determining whether a second command is received from the host during a reference time following the first reference time point; and
- generating the error count by counting the number of the first-type error bits of the target super block when the second command is not received.

* * * * *